(12) United States Patent
Pang et al.

(10) Patent No.: US 9,859,298 B1
(45) Date of Patent: Jan. 2, 2018

(54) AMORPHOUS SILICON LAYER IN MEMORY DEVICE WHICH REDUCES NEIGHBORING WORD LINE INTERFERENCE

(71) Applicant: SanDisk Technologies LLC, Plano, TX (US)

(72) Inventors: Liang Pang, Fremont, CA (US); Jayavel Pachamuthu, San Jose, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/190,574

(22) Filed: Jun. 23, 2016

(51) Int. Cl.
*H01L 29/792* (2006.01)
*H01L 27/11582* (2017.01)
(Continued)

(52) U.S. Cl.
CPC .... *H01L 27/11582* (2013.01); *H01L 21/0217* (2013.01); *H01L 21/02164* (2013.01); *H01L 21/02238* (2013.01); *H01L 21/02532* (2013.01); *H01L 21/02592* (2013.01); *H01L 21/02595* (2013.01); *H01L 21/02667* (2013.01); *H01L 21/28282* (2013.01); *H01L 21/31111* (2013.01); *H01L 27/11568* (2013.01); *H01L 29/66545* (2013.01)

(58) Field of Classification Search
CPC ....... H01L 27/115852; H01L 21/02238; H01L 27/11568
See application file for complete search history.

(56) References Cited

U.S. PATENT DOCUMENTS 6,037,273 A   3/2000 Gronet et al.
6,114,258 A   9/2000 Miner et al.
(Continued)

OTHER PUBLICATIONS

Goda, A., et al., "A novel surface-oxidized barrier-SiN cell technology to improve endurance and read-disturb characteristics for gigabit NAND flash memories," International Electron Devices Meeting, Technical Digest, Dec. 10-13, 2000, Abstract from IEEE Xplore Digital Library, 2 pages.
(Continued)

*Primary Examiner* — Jamie C Niesz
(74) *Attorney, Agent, or Firm* — Vierra Magen Marcus LLP

(57) ABSTRACT

Techniques for fabricating a memory device which has reduced neighboring word line interference, and a corresponding memory device. The memory device comprises a stack of alternating conductive and dielectric layers, where the conductive layers form word lines or control gates of memory cells. In one aspect, rounding off of the control gate layers due to inadvertent oxidation during fabrication is avoided. An amorphous silicon layer is deposited along the sidewall of the memory holes, adjacent to the control gate layers. $Si_3N_4$ is deposited along the amorphous silicon layer and oxidized in the memory hole to form $SiO_2$. The amorphous silicon layer acts as an oxidation barrier for the sacrificial material of the control gate layers. The amorphous silicon layer is subsequently oxidized to also form $SiO_2$. The two $SiO_2$ layers together form a blocking oxide layer.

14 Claims, 22 Drawing Sheets

(51) Int. Cl.
*H01L 29/66* (2006.01)
*H01L 21/02* (2006.01)
*H01L 21/311* (2006.01)
*H01L 21/28* (2006.01)
*H01L 27/11568* (2017.01)

(56) References Cited

U.S. PATENT DOCUMENTS

| | | | |
|---|---|---|---|
| 6,211,098 B1 | 4/2001 | Twu et al. | |
| 8,283,228 B2 | 10/2012 | Alsmeier | |
| 8,829,595 B2* | 9/2014 | Lee | H01L 29/66833 257/324 |
| 9,123,580 B2* | 9/2015 | Lee | H01L 29/66833 |
| 9,287,290 B1 | 3/2016 | Rabkin et al. | |
| 9,305,849 B1* | 4/2016 | Tsutsumi | H01L 21/28282 |
| 9,524,984 B1* | 12/2016 | Lee | H01L 27/11582 |
| 2002/0146914 A1 | 10/2002 | Huang et al. | |
| 2009/0242962 A1 | 10/2009 | Ramkumar et al. | |
| 2009/0321813 A1 | 12/2009 | Kidoh et al. | |
| 2011/0215333 A1 | 9/2011 | Aoyama et al. | |
| 2012/0001247 A1* | 1/2012 | Alsmeier | H01L 27/11551 257/316 |
| 2013/0264631 A1 | 10/2013 | Alsmeier et al. | |
| 2014/0035026 A1 | 2/2014 | Jang et al. | |
| 2014/0291751 A1* | 10/2014 | Lee | H01L 29/792 257/324 |
| 2015/0155297 A1 | 6/2015 | Eom et al. | |
| 2016/0093390 A1 | 3/2016 | Yuan et al. | |
| 2016/0133638 A1* | 5/2016 | Simsek-Ege | H01L 27/11524 257/314 |

OTHER PUBLICATIONS

Tamaoki, N., et al., "Low Temperature Solution for Silicon Nitride LPCVD Using CI-Free Inorganic Trsilylamine," [www.electrochem.org/dl/ma/203/pdfs/2160.pdf], Feb. 2003, 1 page.

Lee, Won-Jun, et al., "A Comparative Study on the Si Precursors for the Atomic Layer Deposition of Silicon Nitride Thin Films," Journal of the Korean Physical Society, vol. 45, No. 5, Nov. 2004, pp. 1352-1355.

Liu, Xinye, et al., "ALD of Hafnium Oxide Thin Films from Tetrakis (ethylmethylamino) hafnium and Ozone," Journal of the Electrochemical Society, vol. 152, No. 3, Jan. 1, 2005, p. G213-G219.

International Search Report & The Written Opinion of the International Searching Authority dated May 30, 2017, International Application No. PCT/US2017/018759.

* cited by examiner

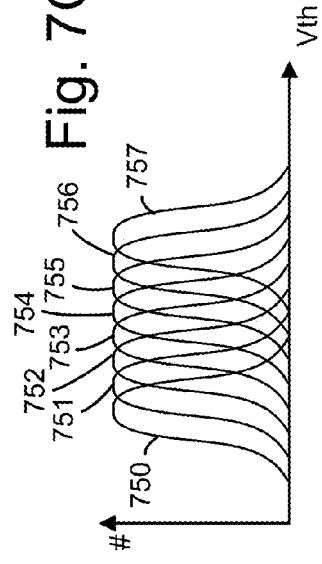
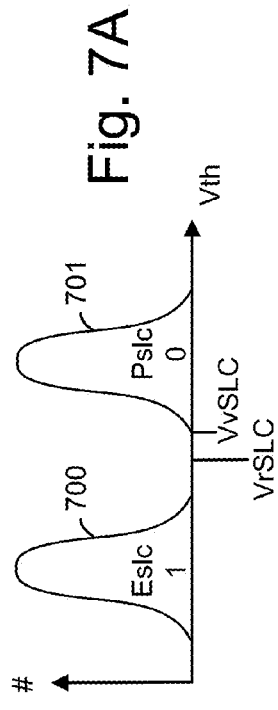
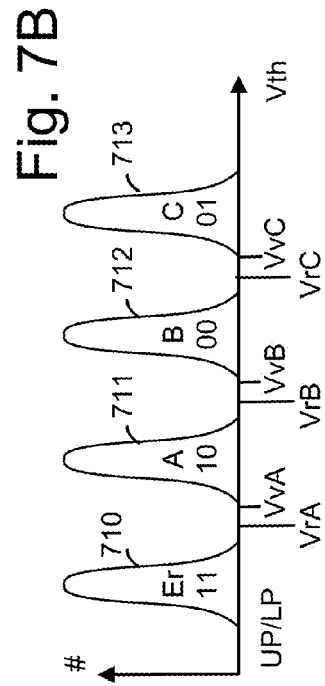
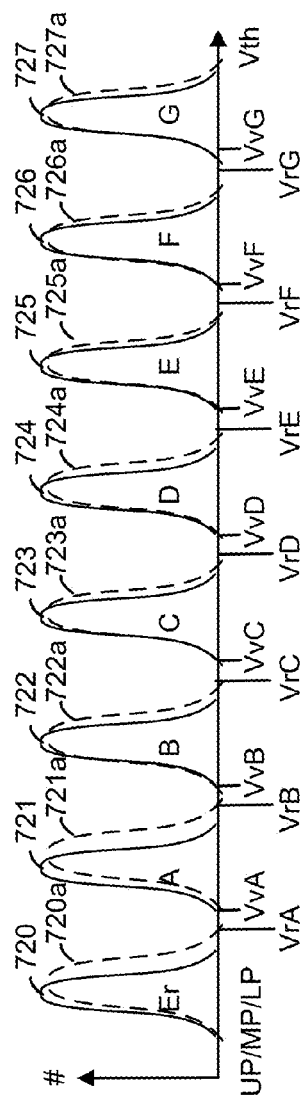

AMORPHOUS SILICON LAYER IN MEMORY DEVICE WHICH REDUCES NEIGHBORING WORD LINE INTERFERENCE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 7A depicts example Vth distributions of memory cells, where two data states are used.

FIG. 7B depicts example Vth distributions of memory cells, where four data states are used.

FIG. 7C1 depicts example Vth distributions of memory cells, where eight data states are used.

FIG. 7C2 depicts example upshifts in the Vth distribution of WLn memory cells according to the programmed state of WLn+1 memory cells.

DETAILED DESCRIPTION

Figure 1:
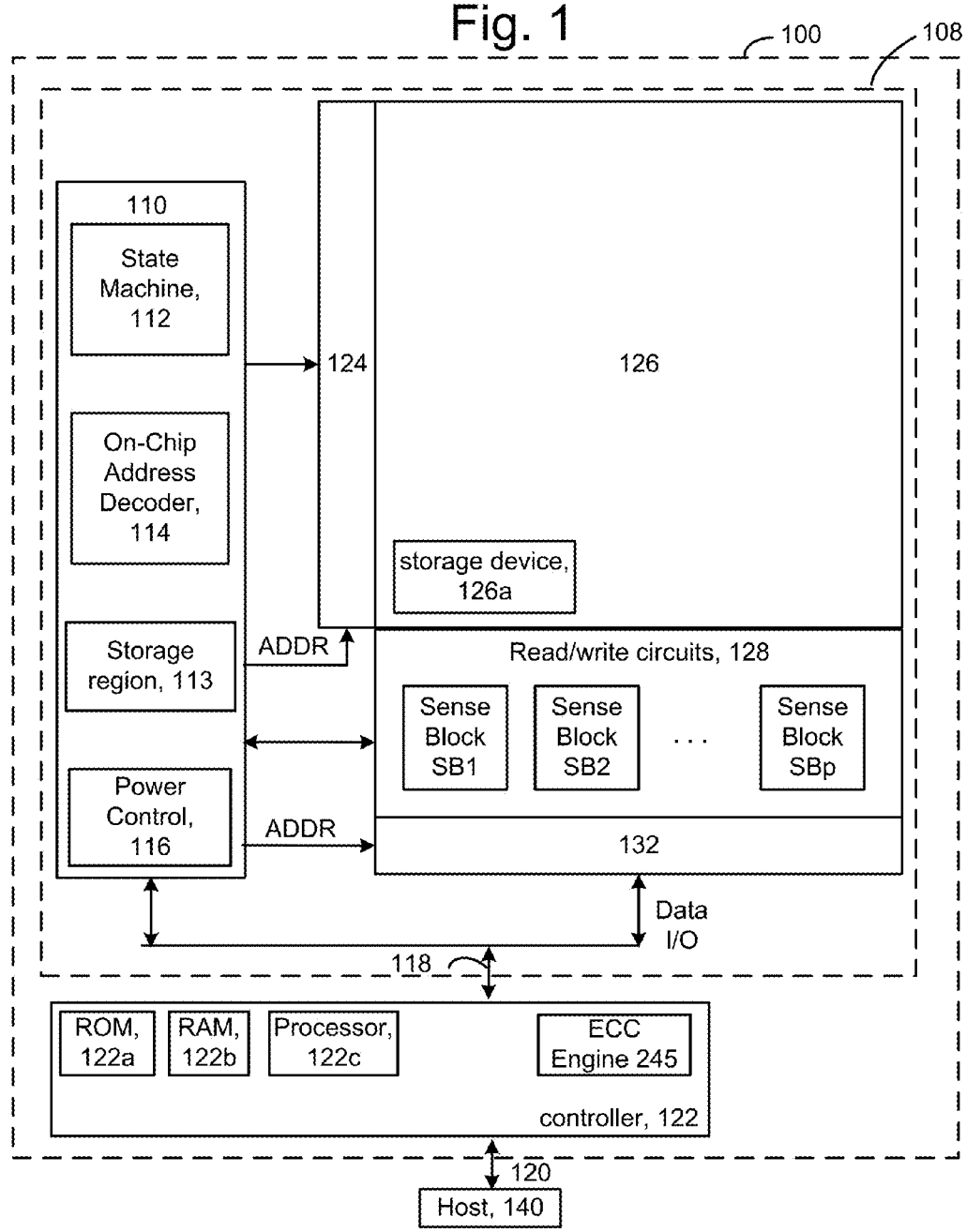
FIG. 1 is a block diagram of an example memory device.

Techniques are provided for fabricating a memory device which has reduced neighboring word line interference. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state (Eslc) and the programmed state (Pslc) (see FIG. 7A). In a two-bit per cell memory device, there are four data states including the erased state and three higher data states referred to as the A, B and C data states (see FIG. 7B). In a three-bit per cell memory device, there are eight data states including the erased state and seven higher data states referred to as the A, B, C, D, E, F and G data states (see FIG. 7C1). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 7D) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

In one approach, the memory device comprises a stack of alternating conductive and dielectric layers, where the conductive layers form word lines or control gates of memory cells. The memory cells may be in strings which extend vertically in the stack. Further, the memory cells may be formed by an annular layers of blocking oxide, charge-trapping material, tunnel oxide and channel polysilicon which extend in the stack. The layers may be arranged concentrically. When a program voltage is applied to a one of the word lines, and a pass voltage is applied to unselected word lines, an electric field is created which draws electrons from the channel layer into a portion of the charge-trapping material which is adjacent to the word line. When the amount of charge corresponds to a desired data state, the programming is completed.

However, the electric field includes a fringing or lateral component which can draw electrons from the channel layer into a portion of the charge-trapping material which is between word lines. Electrons can also move laterally within the charge-trapping layer from a portion which is adjacent to the word lines to a portion of the charge-trapping material which is between word lines. These electrons form a parasitic cell which does not store data. As different word lines are used for programming in the device, additional parasitic cells can be formed. The parasitic cells interfere with the ability to accurately program the cells and result in widened Vth distributions.

In particular, for a cell of a given word line WLn, the programming of the cell of the next word line WLn+1 will increase the Vth of the cell of WLn. Moreover, the increase is proportional to the amount by which the data state (Vth) of the cell of WLn+1 exceeds the data state (Vth) of the cell of WLn (in the same NAND string or other set of connected cells). The most interference or upshift in Vth will be experienced by a low state cell on WLn when there is a high state cell on WLn+1. Moreover, this problem will become worse as memory devices are scaled down in size and the space between cells decreases.

Techniques provided herein address the above and other issues. In one aspect, the memory device is provided with a reduced fringing electric field by avoiding a rounding off of the control gate layers which can occur during fabrication. In particular, the formation of the blocking oxide layer in the memory hole can result in inadvertent oxidation of portions of the sacrificial material of the control gate layers. By reducing or avoiding this inadvertent oxidation, the rounding off of the corners is avoided. Other benefits including reducing short-channel effects of the memory cells is formed. One approach involves depositing an amorphous silicon layer along the sidewall of the memory holes, adjacent to the control gate layers and dielectric layers. Subsequently, a material such as $Si_3N_4$ is deposited along the amorphous silicon layer and oxidized in the memory hole to form $SiO_2$. The amorphous silicon layer acts as an oxidation barrier for the sacrificial material of the control gate layers, which may also comprise $Si_3N_4$.

The amorphous silicon layer is oxidized in a back-side process, by removing the sacrificial material of the control gate layers to form voids and introducing an oxidizing agent in the voids. The amorphous silicon may also be converted to $SiO_2$, so that the two adjacent $SiO_2$ layers form a blocking oxide layer. In one option, $SiO_2$ is deposited on the amorphous silicon layer rather than being oxidized in the memory hole. In another option, the control gate layers are recessed. This increases the distance between the control gate and the channel region between the word line layers so that the fringing electric field is weakened. In another option, the channel polysilicon is converted to single crystal silicon.

Various other features and benefits are described below.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for program and read parameters as described further below.

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein. For example, a control circuit may include any one of, or a combination of, control circuitry 110, state machine 112, decoders 114 and 132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
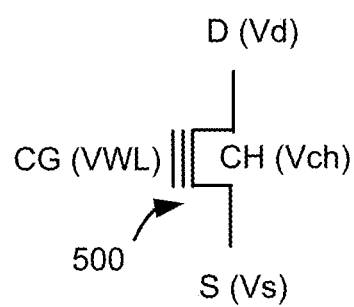
FIG. 2 depicts an example memory cell 500.

FIG. 2 depicts an example memory cell 500. The memory cell comprises a control gate CG which receives a word line voltage Vwl, a drain at a voltage Vd, a source at a voltage Vs and a channel at a voltage Vch.

Figure 3:
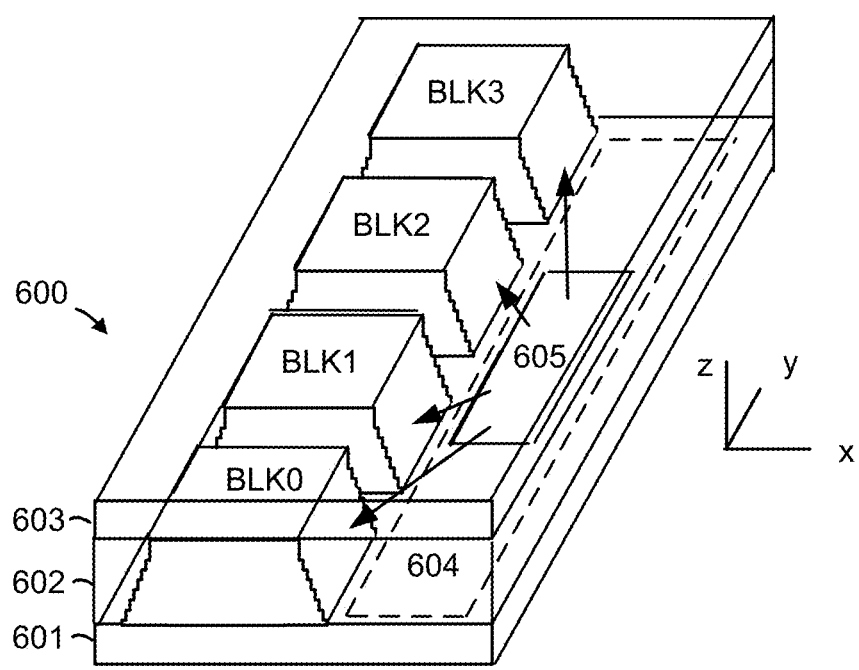
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
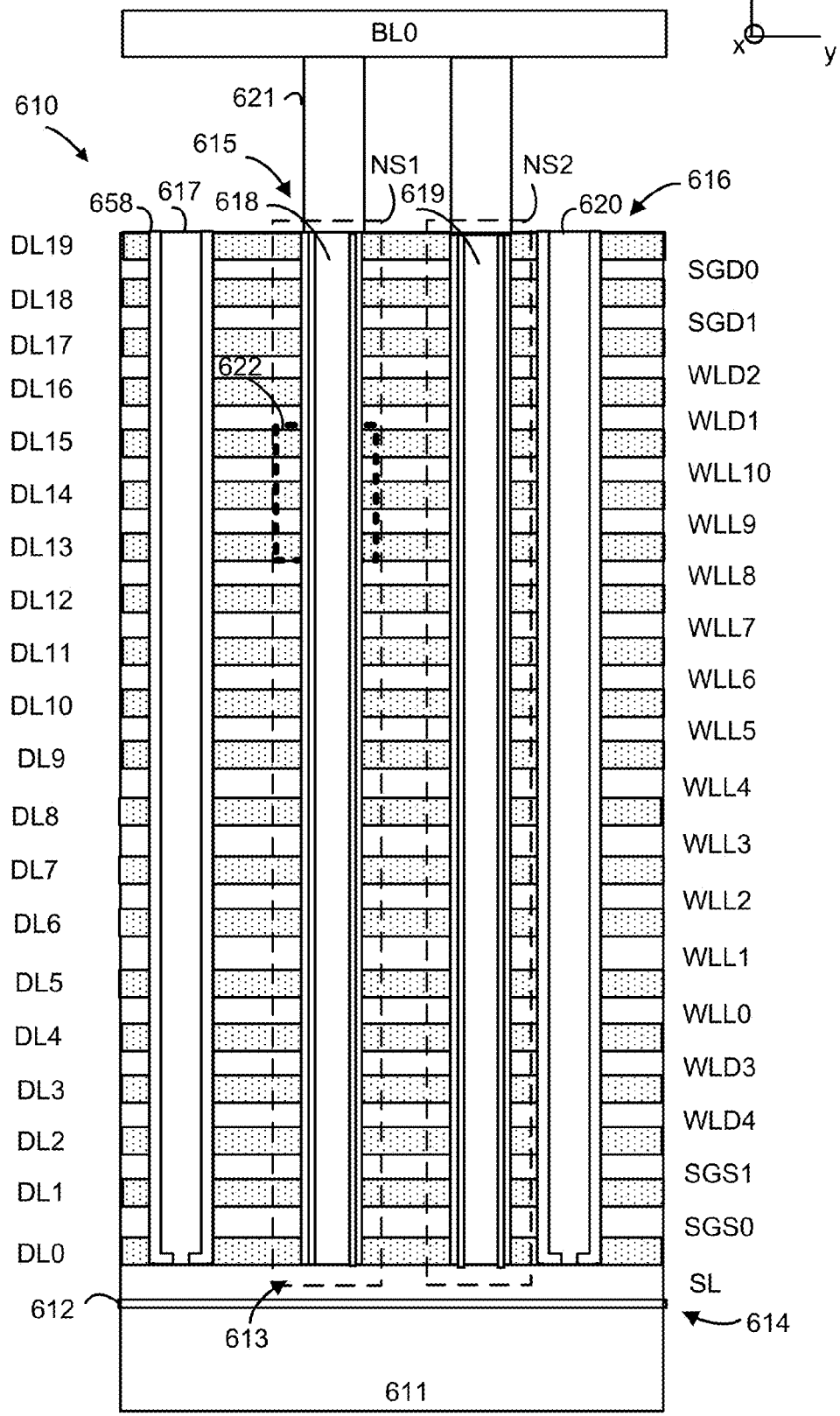
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. The metal in the slits is provided within an insulating liner 658 such as $SiO_2$ which acts as a sidewall insulator. A portion of a bit line BL0 is also depicted. A conductive via 621 connects the drain-end 615 to BL0.

Figure 5:
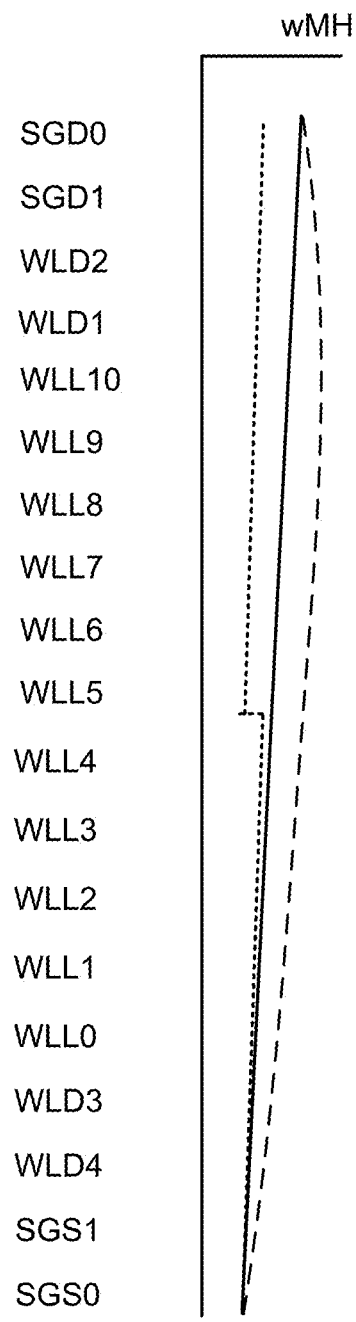
FIG. 5 depicts a plot of memory hole diameter in the stack of FIG. 4.

FIG. 5 depicts a plot of memory hole diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher.

In another possible implementation, represented by the short dashed line, the stack is fabricated in two tiers. The stack can be fabricated in two or more tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
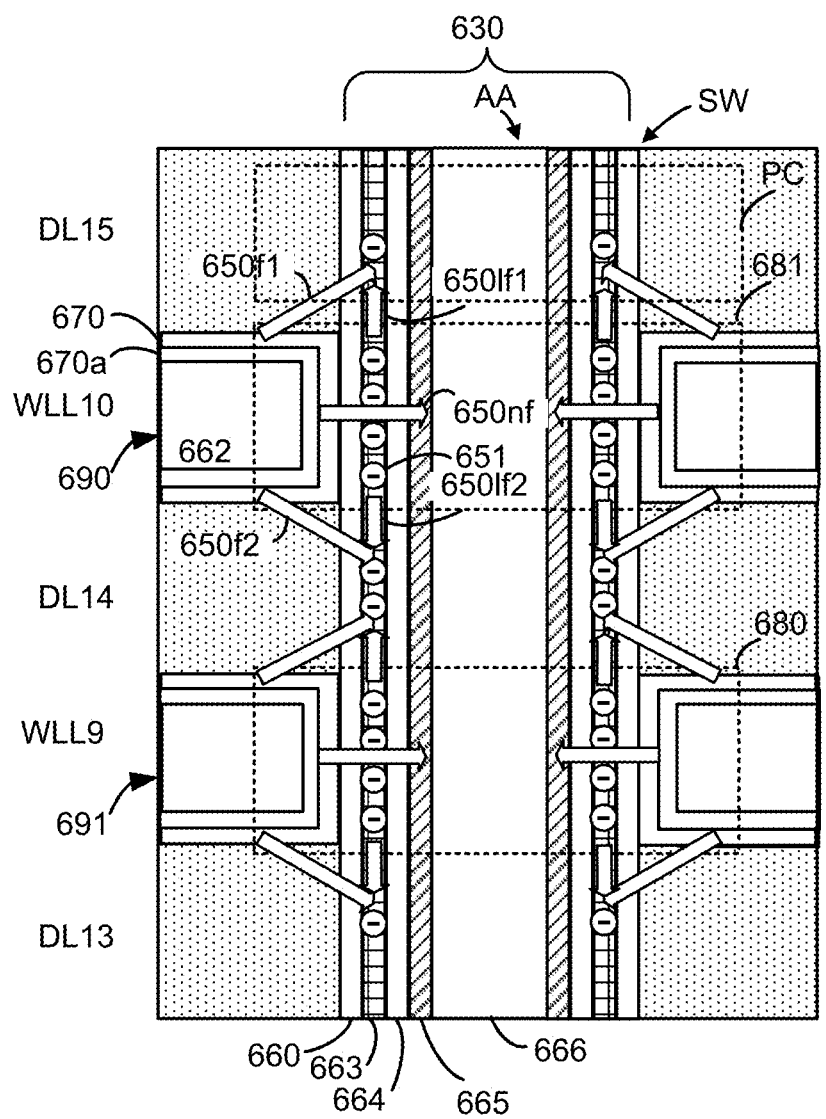
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. For example, memory cells 680 and 681 are formed in WLL9 and WLL10, respectively. The memory cells are formed from films which are deposited along the sidewall (SW) of the memory hole 630 and/or within each word line layer, e.g., using atomic layer deposition. For example, each column (e.g., the pillar which is formed by the materials within a memory hole) can include a blocking oxide layer 660, charge-trapping layer 663 such as $Si_3N_4$ or other nitride, a tunneling oxide layer 664, a channel layer 665 (e.g., comprising polysilicon), and a dielectric core 666. The blocking oxide may comprises a continuous oxide layer such as silicon dioxide along the sidewall, in one approach. The charge-trapping layer, tunneling oxide layer and channel may also comprise continuous layers along the sidewall, in one approach.

A word line layer can include a metal barrier 670a (e.g., TiN, TaN, a nitride based metal barrier layer or a non-nitride metal barrier layer such as Ti or CoW) and a control gate metal 662 (e.g., W, Co, Ti, Ru or Ta) as a control gate. For example, control gates 691 and 690 are provided in WLL9 and WLL10, respectively. A word line layer can also include a high-k block oxide layer 670 such as aluminum oxide ($Al_2O_3$). Additional pillars are similarly formed in the different memory holes. A pillar can form a columnar active area (AA) of a NAND string.

The device can be considered to be a metal-aluminum-nitride-oxide-silicon (MANOS) memory device, where the metal is the control gate metal 662, the aluminum is the aluminum oxide of the high-k block oxide layer 670, the nitride is the charge-trapping layer 663 such as $Si_3N_4$ or other nitride, the oxide is the tunnel oxide layer stack comprising oxide-nitride-oxide such as $SiO_2/SiO_xN_y/SiO_2$ and the silicon is the channel layer 665 (e.g., comprising polysilicon).

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

The blocking oxide layer 660 includes portions which are adjacent to, and span a height of, the control gate layers and the dielectric layers. The height is along the vertical or z-axis. Similarly, the charge-trapping layer 663 includes portions which are adjacent to, and span a height of, the control gate layers and the dielectric layers.

During programming, an electric field is created by the program voltage which is applied to the control gate of a selected word line and by the pass voltage which is applied to the control gates of unselected word lines. For the control gate 690, the electric field includes fringing electric field paths 650f1 and 650f2 and a non-fringing electric field path 650nf. Corresponding electric field portions are also depicted for WLL9. The electric field can occur when Vpgm or Vpass is applied to a control gate. Electrons, e.g., electron 651, are represented by circles with a horizontal line. Electrons are drawn into a portion of the charge-trapping layer which is adjacent to the control gate layer by the non-fringing electric field path 650nf to program the memory cell 681.

However, a smaller but still detectable number of electrons are also drawn into the portions of the charge-trapping layer which are adjacent to the dielectric layers by the fringing electric field path 650f1 and 650f2, resulting in corresponding parasitic cells, e.g., parasitic cell PC. It is also possible for electrons which are in portions of the charge-trapping layer adjacent to the word lines to move laterally in the charge-trapping layer to portions of the charge-trapping layer adjacent to the dielectric layers, also contributing to the parasitic cells. This movement is represented by arrows 650lf1 and 650lf2. When the memory cells 680 or 681 are sensed, such as during a read operation or program-verify operation, the parasitic cells will result in a resistance which distorts the sensing and can cause program disturb. In particular, the usual read pass voltage which is applied to the unselected word lines may not be high enough to provide the parasitic cells in a conductive state.

The severity of the problem of parasitic cells depends on the strength of the fringing electric field. As discussed further below, e.g., in FIG. 10C, the fringing field can be affected by an inadvertent rounding off of the control gates.

As shown, each of the memory holes can be filled with a plurality of annular layers comprising a blocking oxide layer, a charge-trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts example Vth distributions of memory cells, where two data states are used. During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

A Vth distribution 700 represents an erased state (Eslc) and a Vth distribution 701 represents a programmed data state (Pslc), in an example of single-level cell (SLC) programming. The erased state may represent a one bit while the programmed state represents a zero bit, for example. A verify voltage for the programmed state is VvSLC and a read voltage for distinguishing between the two states is VrSLC. Generally, a read voltage for distinguishing between adjacent states, e.g., a lower state and a higher state, should be located midway between the expected upper tail of the Vth distribution of the lower state and the expected lower tail of the Vth distribution of the higher state.

FIG. 7B depicts example Vth distributions of memory cells, where four data states are used. The data states are represented by Vth distributions 710, 711, 712 and 713 for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

FIG. 7C1 depicts example Vth distributions of memory cells, where eight data states are used. The verify voltages of the A, B, C, D, E, F and G states are VvA, VvB, VvC, VvD, VvE, VvF and VvG, respectively. A first set of read voltages for the A, B, C, D, E, F and G states includes VrA, VrB, VrC, VrD, VrE, VrF and VrG, respectively. For the A, B, C, D, E, F and G states, an example encoding of bits for each state is 111, 110, 100, 000, 010, 011, 001 and 101, respectively. The ideal data states are represented by Vth distributions 720, 721, 722, 723, 724, 725, 726 and 727 for the Er, A, B, C, D, E, F and G states, respectively. When the parasitic cells are present, the Vth distributions are widened and upshifted. In this case, the data states are represented by Vth distributions 720a, 721a, 722a, 723a, 724a, 725a, 726a and 727a for the Er, A, B, C, D, E, F and G states, respectively. As mentioned, the lower states experience a relatively larger upshift and widening in Vth, since more neighboring word line interference occurs.

In this experiment, the Vth distributions of cells on WLn were measured before (solid lines) and after (dashed lines) programming of cells on WLn+1. The cells on WLn+1 are programmed to randomly selected data states. The Vth width becomes significantly wider for the WLn cells after the WLn+1 cells are programmed.

FIG. 7C2 depicts example upshifts in the Vth distribution of WLn memory cells according to the programmed state of WLn+1 memory cells. In this example, the WLn memory cells are in the A state. The Vth distribution becomes progressively higher as the data state of the cells on WLn+1 becomes progressively higher. Recall that the WLn+1 cells are programmed after the WLn cells. Vth distributions 750, 751, 752, 753, 754, 755, 756 and 757 correspond to the WLn+1 cells being in the Er, A, B, C, D, E, F or G states, respectively. This shows that the Vth upshift of the cells on WLn due to parasitic cells is a function of the data state of the WLn+1 cells.

Figure 7D:
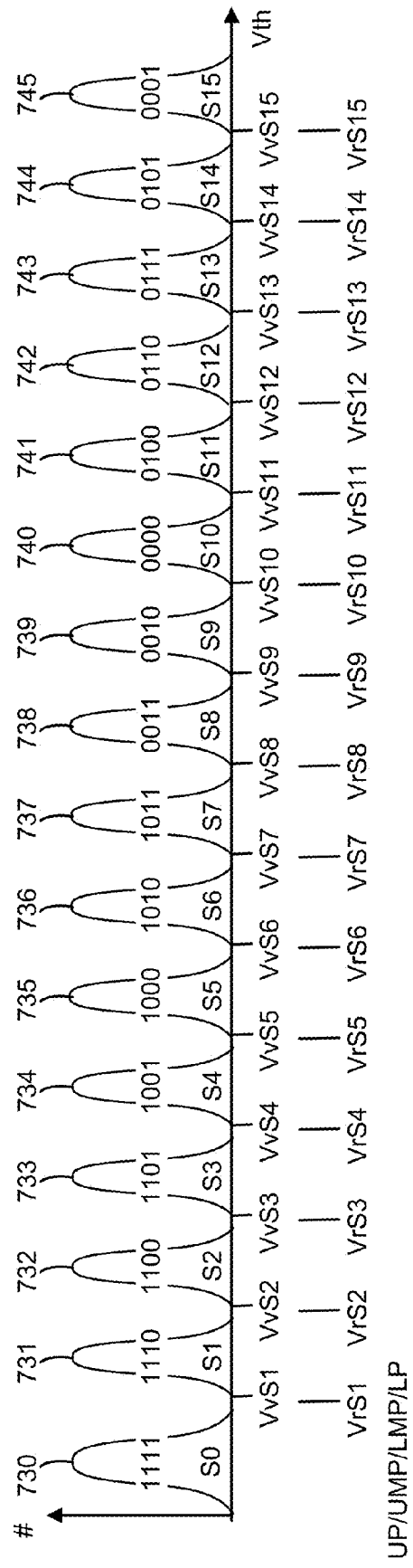
FIG. 7D depicts example Vth distributions of memory cells, where sixteen data states are used.

FIG. 7D depicts example Vth distributions of memory cells, where sixteen data states are used. Programming using four bits per cell (16 levels) can involve lower, lower-middle, upper-middle and upper pages. The data states are represented by Vth distributions 730, 731, 732, 733, 734, 735, 736, 737, 738, 739, 740, 741, 742, 743, 744 and 745 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS4 and VrS15.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

Figure 8:
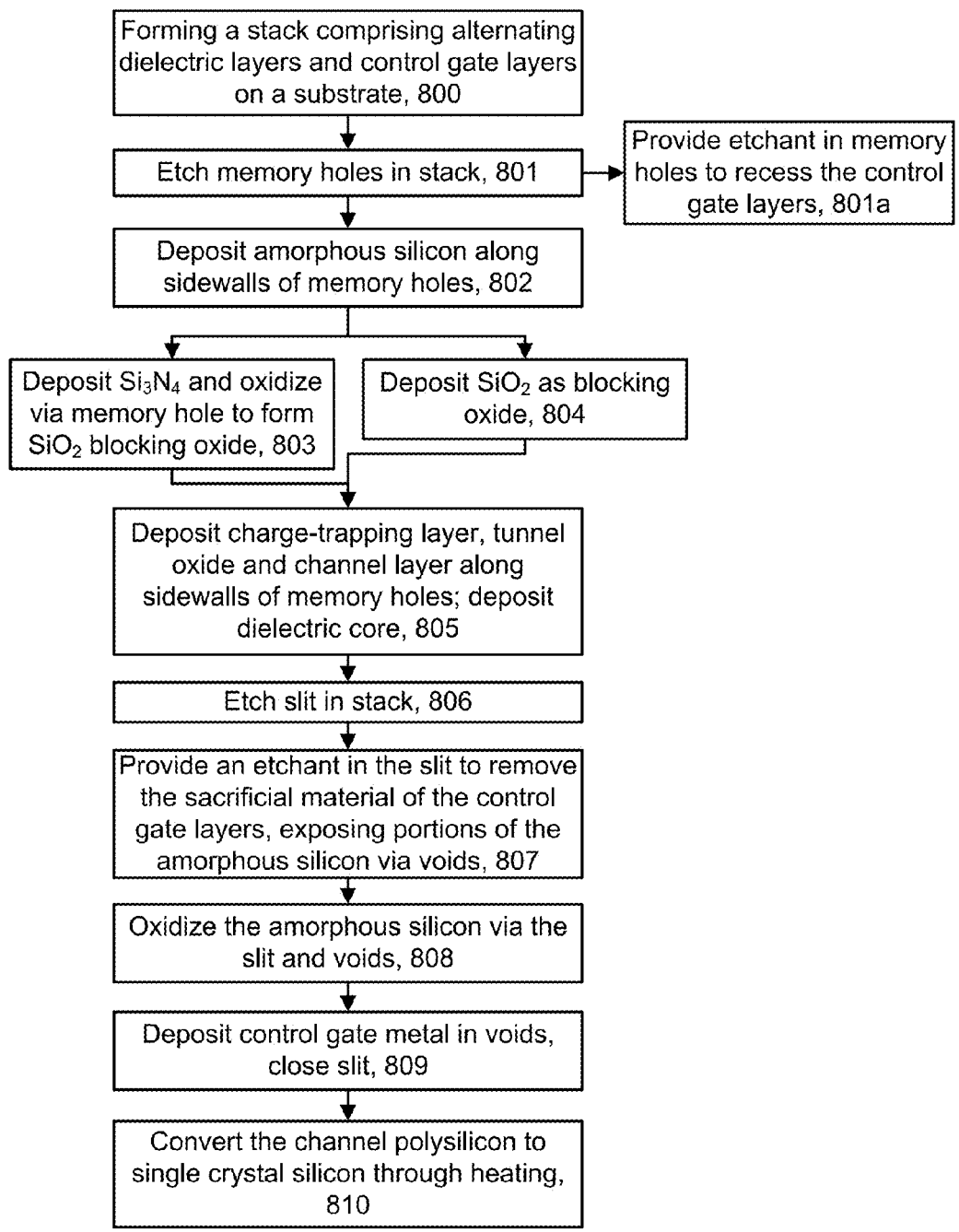
FIG. 8 depicts an example process for fabricating a memory device with reduced neighboring word line interference.

FIG. 8 depicts an example process for fabricating a memory device with reduced neighboring word line interference. Step 800 includes forming a stack comprising alternating dielectric layers and control gate layers on a substrate. In one approach, the control gate layers initially comprise a sacrificial material such as $Si_3N_4$. See, e.g., FIG. 9A. Step 801 includes etching memory holes in the stack.

Figure 9A:
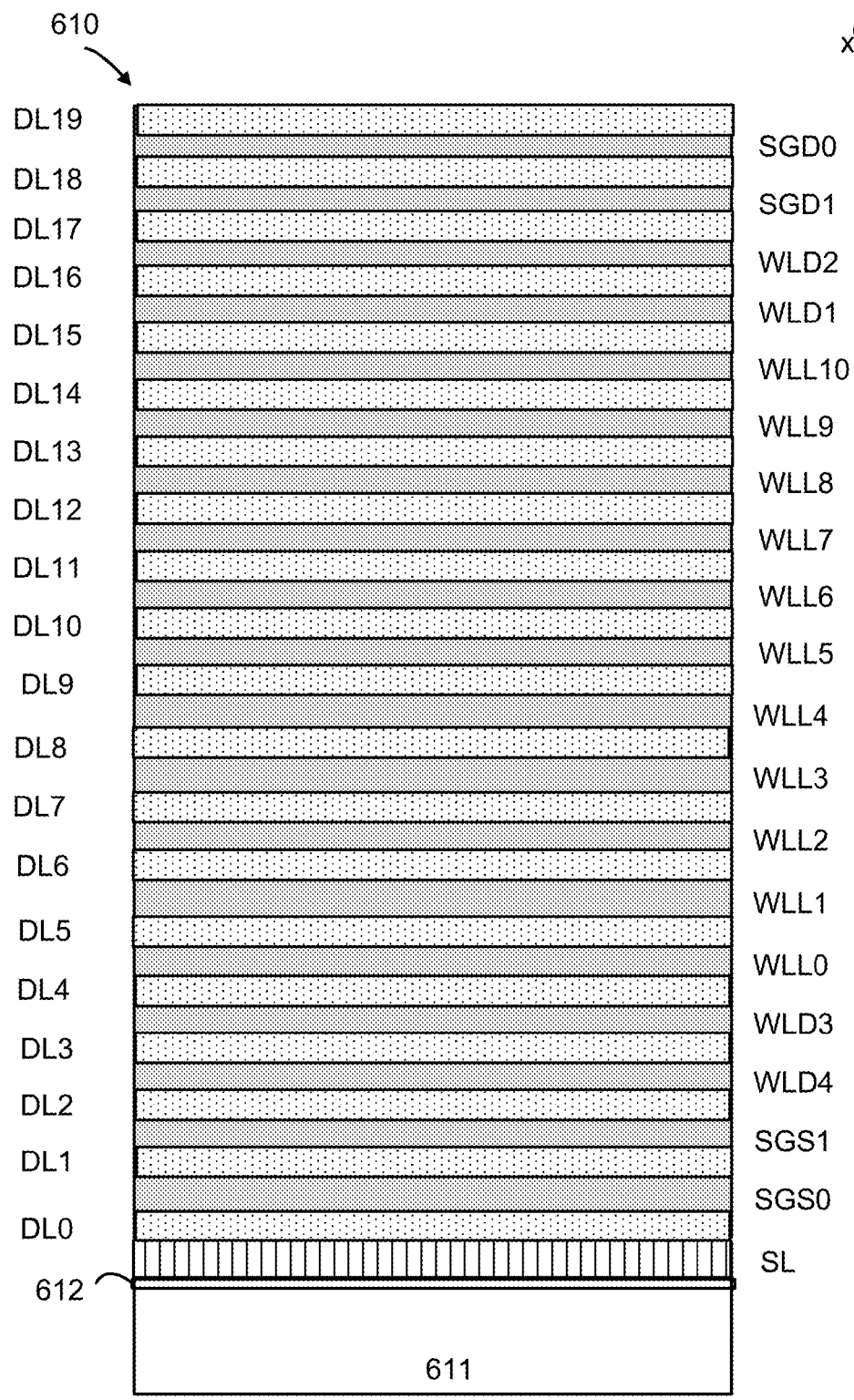
FIG. 9A depicts an example cross-sectional view of a stack of a memory device during a fabrication process consistent with step 800 of FIG. 8, where the stack includes alternating dielectric and control gate layers.
Figure 9B:
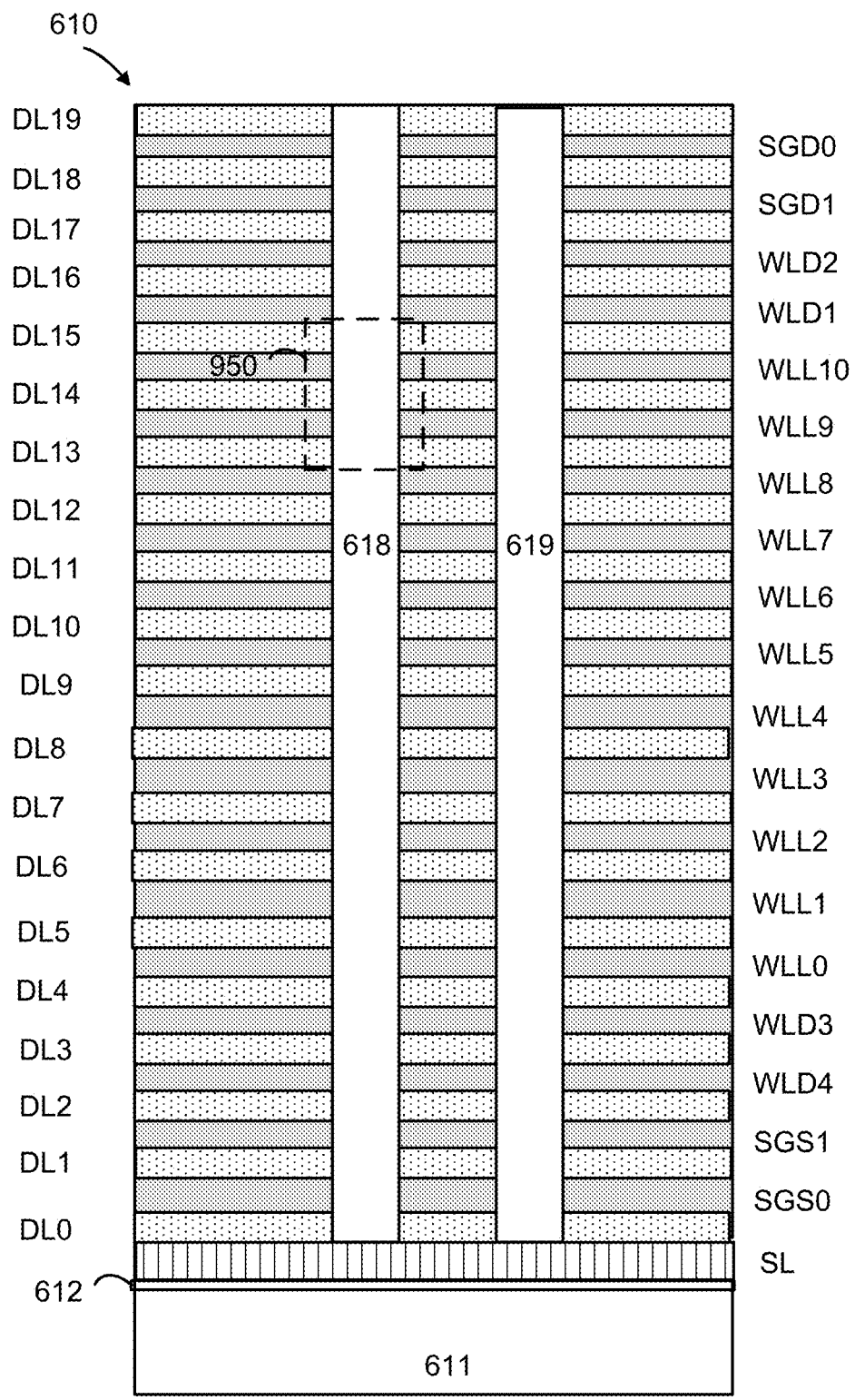
FIG. 9B depicts an example cross-sectional view of the stack of FIG. 9A after memory holes are formed, consistent with step 801 of FIG. 8.

See, e.g., FIG. 9B. Optionally, step 801a is used to provide an etchant in the memory holes to recess the control gate layers. See, e.g., FIG. 13. This step may include providing an etchant in the memory hole to recess the sacrificial material before providing the amorphous silicon layer along the sidewall. The etchant can be a wet or dry etchant which is more selective of the sacrificial material of the control gate layer than of the dielectric layers.

Generally, a wet etch uses a liquid-phase etchant such as diluted hydrofluoric acid. A dry etch uses a plasma-phase etchant. For example, the source gas for the plasma may comprise trifluoromethane. Example tools for a dry etch include Siconi™ process, chemical dry etching (CDE) and the Frontier™ system of Applied Materials, Inc. Siconi™ refers to a class of remote plasma assisted dry etch processes which involve the simultaneous exposure of a substrate to hydrogen- and fluorine-containing plasma effluents.

Step 802 includes depositing amorphous silicon along the sidewalls of the memory holes, adjacent to the dielectric layers and control gate layers. See, e.g., FIG. 11A. The amorphous silicon layer may be a relatively thin layer, e.g., 3 nm, which is deposited conformally, e.g., conforming to the sidewall of the memory hole. In one approach, the deposition comprises atomic layer deposition (ALD).

Subsequently, one option at step 803 involves depositing an $Si_3N_4$ layer along the amorphous silicon layer. See, e.g., FIG. 11B. Once the $Si_3N_4$ layer is deposited, e.g., as a thin or flat nitride layer, it is oxidized to convert it to, e.g., an $SiO_2$ layer which serves as a blocking oxide layer. The $Si_3N_4$ layer may be deposited using ALD or chemical-vapor deposition (CVD), for instance. In some cases, the $Si_3N_4$ is partially and not fully oxidized so that a composite of $SiO_xN_y$ is formed, where N is in a relatively low concentration. The $Si_3N_4$ layer may have a thickness of 3 nm or less to ensure it is fully oxidized.

In the oxidation processes described herein, wet or dry oxidation can be used. Example of wet oxidation include in-situ steam generation (ISSG) and water vapor generation. Steam such as pyrogenic steam can be produced by burning hydrogen and oxygen in an oxidation furnace. Examples of dry oxidation include plasma isotropic oxidation, rapid plasma oxidation and Slot Plane Antenna (SPA) plasma generating technology. The oxidation can include a heating step at, e.g., 350 C or higher. Another option for oxidation for the $Si_3N_4$ or the amorphous silicon is radical oxidation, which is a combination of wet and dry oxidation.

$Si_3N_4$ can be transformed to $SiO_2$ by the following formula in air or oxygen: $Si_3N_4+3O_2 \rightarrow 3SiO_2+2N_2$. In this case, nitrogen ($N_2$) is a byproduct. Or, in the presence of high-pressure $H_2O$, $Si_3N_4$ can be transformed to $SiO_2$ by the following formula: $Si_3N_4+6H_2O \rightarrow 3SiO_2+4NH_3$. In this case, ammonia ($NH_3$), comprising nitrogen and hydrogen, is a byproduct.

Wet oxidation of the $Si_3N_4$ layer can result in better quality and uniformity in the oxide but dry oxidation is also possible. The wet oxidation can involve a water molecule such as steam which provides high energy oxide radicals that interact with the $Si_3N_4$ and break the Si—N bonds. The nitrogen is carried away while the oxygen bonds with the Si, creating $SiO_2$.

Step 803 can involve depositing a material comprising silicon in the memory hole, adjacent to the amorphous silicon layer, oxidizing the material comprising silicon in the memory hole to provide a material comprising oxidized silicon, wherein the material comprising oxidized silicon and the oxidized silicon layer formed in step 808 together form a blocking oxide layer. In one approach, the material comprising silicon comprises $Si_3N_4$, the material comprising oxidized silicon comprises $SiO_2$, and the oxidized silicon layer comprises $SiO_2$.

Another option at step 804 is to deposit the $SiO_2$ directly as a blocking oxide layer, e.g., using ALD. This approach does not involve a conversion from $Si_3N_4$ to $SiO_2$. Generally, a high quality $SiO_2$ can be obtained via oxidation using step 803 while step 804 may be easier. Step 804 can involve depositing a material comprising oxidized silicon in the memory hole, adjacent to the amorphous silicon layer, wherein the material comprising oxidized silicon and the oxidized silicon layer together form a blocking oxide layer. Further, the material comprising oxidized silicon may comprise $SiO_2$ and the oxidized silicon layer may comprise $SiO_2$.

Step 805 includes depositing, in turn, a charge-trapping layer, a tunnel oxide and a channel layer along the sidewalls of the memory holes. See, e.g., FIGS. 9C and 11C. A dielectric core such as $SiO_2$ is also provided to fill a remainder of the memory holes.

Step 806 includes etching a slit in the stack. See, e.g., FIG. 9D. Step 807 includes providing an etchant in the slit to remove the sacrificial material of the control gate layers, thus exposing portions of the amorphous silicon layer. See, e.g., FIG. 11C. The sacrificial material may comprise $Si_3N_4$ and the dielectric layers may comprise oxide. The etchant can be a wet or dry etchant which is more selective of the sacrificial material of the control gate layer than of the dielectric layers. Step 808 includes oxidizing the amorphous silicon via the slits and voids. See, e.g., FIGS. 9D and 11D. The oxidizing of the amorphous silicon layer provides an oxidized silicon layer, e.g., $SiO_2$, and the oxidizing comprises supplying oxygen via the slit and voids. A wet or dry oxidation may be used, as discussed. Wet oxidation of the amorphous silicon layer can result in better quality and uniformity in the oxide compared to dry oxidation. Further, the oxidation may be complete, resulting in $SiO_2$. The degree of oxidation of the amorphous silicon depends on the thickness of the layer. A thicker film, e.g., more than 3 nm thick, will have a lower degree of oxidation. A thinner film, e.g., 3 nm or less, will generally be completely oxidized.

Although only the portions of the amorphous silicon layer which are at the heights of the control gate layers are exposed, the oxidizing agent can migrate to reach the portions of the amorphous silicon layer which are at the heights of the dielectric layers.

In a dry oxidation process, the formula for converting amorphous silicon to $SiO_2$ is: $Si+O_2 \rightarrow SiO_2$. In this case, there is no gaseous byproduct. In a wet oxidation process, the formula for converting amorphous silicon to $SiO_2$ is: $Si+2H_2O \rightarrow SiO_2+2H_2$. In this case, hydrogen ($H_2$) is a byproduct.

Step 809 includes depositing a control gate metal in the voids and closing the slit. See, e.g., FIGS. 9F, 9G and 11E.

The $SiO_2$ layer formed from amorphous silicon can differ from the $SiO_2$ layer formed from $Si_3N_4$ or directly deposited in the memory hole. For example, the two $SiO_2$ layers can be distinguished by atomic percentage of hydrogen using an elemental analysis method. Hydrogen can be present in the two $SiO_2$ layers as a byproduct.

In one approach, the $SiO_2$ layer formed from amorphous silicon in step 808 will have a lower percentage of atomic hydrogen than the $SiO_2$ formed from oxidizing $Si_3N_4$ in step 803. The amorphous silicon may be converted to $SiO_2$ at a relatively high temperature such as >800 C, such that atomic hydrogen is driven away from the converted $SiO_2$ layer. The atomic percentage of hydrogen is H1%. The atomic hydrogen may originate from precursors such as $SiH_2Cl_2$ (dichlorosilane). On the other hand, $SiO_2$ may be converted from $Si_3N_4$ at a relatively low temperature such as <800 C, such that a certain percentage of hydrogen (H2%) remains in the film and is not driven out. An example precursor is $SiH_2Cl_2$. Moreover, if $SiCl_4$ is used as a precursor for $Si_3N_4$ deposition, Cl remain in the film.

The $SiO_2$ layer formed from amorphous silicon in step 808 may also have a lower percentage of atomic hydrogen than the $SiO_2$ which is deposited by ALD or CVD in step 804. ALD may be performed at a relatively low temperature such as ≤500 C, so that the hydrogen content (H3%) is relatively high in films deposited using ALD. Films deposited using low-pressure CVD (LPCVD) may have a maximum deposition temperature of 780 C, for example. $SiH_2Cl_2$ may be used as a precursor. Since the temperature is less than 800 C, the percentage of hydrogen (H4%) is higher than in the $SiO_2$ obtained from converted amorphous silicon.

Thus, H2%>H1%, H3%>H1%, H4%>H1% and H4%>H3%, in example implementations.

Optionally, step 810 includes converting the channel polysilicon to single crystal silicon through heating, e.g., at 900 C. Single crystal silicon has a lower density of interface traps and no grain boundaries. This can improve Vth distribution widths, electron mobility, cell current, subthreshold slope, short-term data retention and temperature-based Vth shifts.

Note that the steps depicted in FIG. 8 can be performed in different orders in different implementations. For example, step 810 could occur earlier in the process. Also, step 807 could occur later in the process.

Step 805 can include providing a charge-trapping layer, a tunneling layer, and a channel layer in the memory holes, after the providing the amorphous silicon layer along the sidewall in step 802 and before the oxidizing the amorphous silicon layer in step 808. Further, providing the channel layer in step 805 can comprise depositing polysilicon adjacent to the tunneling layer and heating the polysilicon to form single crystal silicon consistent with step 810.

FIG. 9A depicts an example cross-sectional view of a stack of a memory device during a fabrication process consistent with step 800 of FIG. 8, where the stack includes alternating dielectric and control gate layers. The dielectric layers may comprise oxide and the control gate layers may comprise $Si_3N_4$, for example, at this stage. The stack includes a substrate 611 and an insulating film 612 on the substrate.

FIG. 9B depicts an example cross-sectional view of the stack of FIG. 9A after memory holes are formed, consistent with step 801 of FIG. 8. A region 950 of the stack is discussed in FIG. 10A. The memory holes may be formed by etching.

Figure 9C:
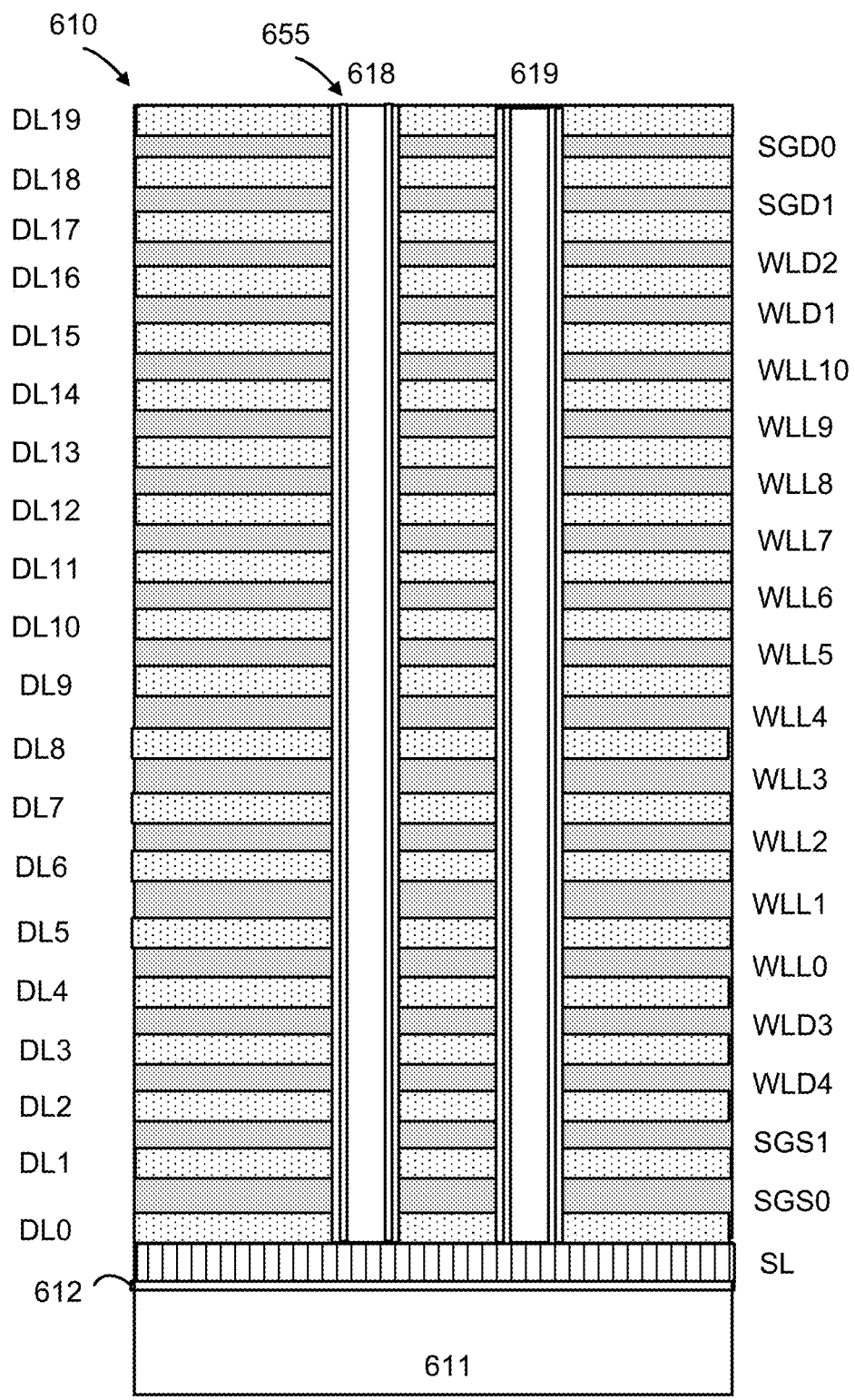
FIG. 9C depicts an example cross-sectional view of the stack of FIG. 9B after films 655 are deposited in the memory holes, consistent with steps 802-805 of FIG. 8.

FIG. 9C depicts an example cross-sectional view of the stack of FIG. 9B after films 655 are deposited in the memory holes, consistent with steps 802-805 of FIG. 8. The materials can include a blocking oxide layer, a charge-trapping layer, a tunneling layer, a channel layer and a dielectric core.

Figure 9D:
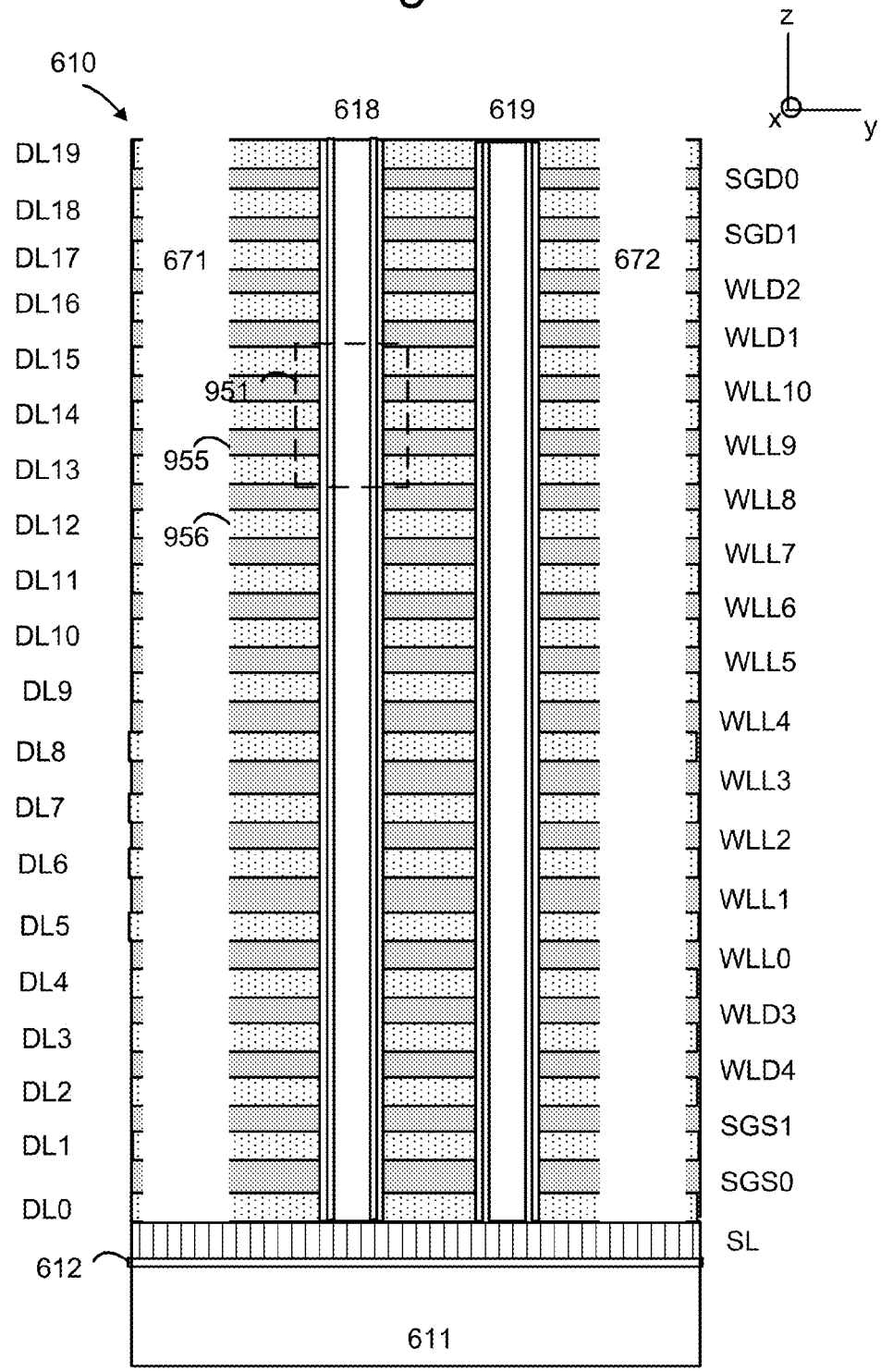
FIG. 9D depicts an example cross-sectional view of the stack of FIG. 9C after slits 671 and 672 are formed in the stack, consistent with step 806 of FIG. 8.

FIG. 9D depicts an example cross-sectional view of the stack of FIG. 9C after slits 671 and 672 are formed in the stack, consistent with step 806 of FIG. 8. The slits may be formed by etching and may extend along the z-axis and the x-axis along the stack. A region 951 of the stack is discussed in FIGS. 10D, 11E, 11F and 12B. Sacrificial material 955 of the control gate layers is depicted. Material 956 of the dielectric layers is also depicted.

Figure 9E:
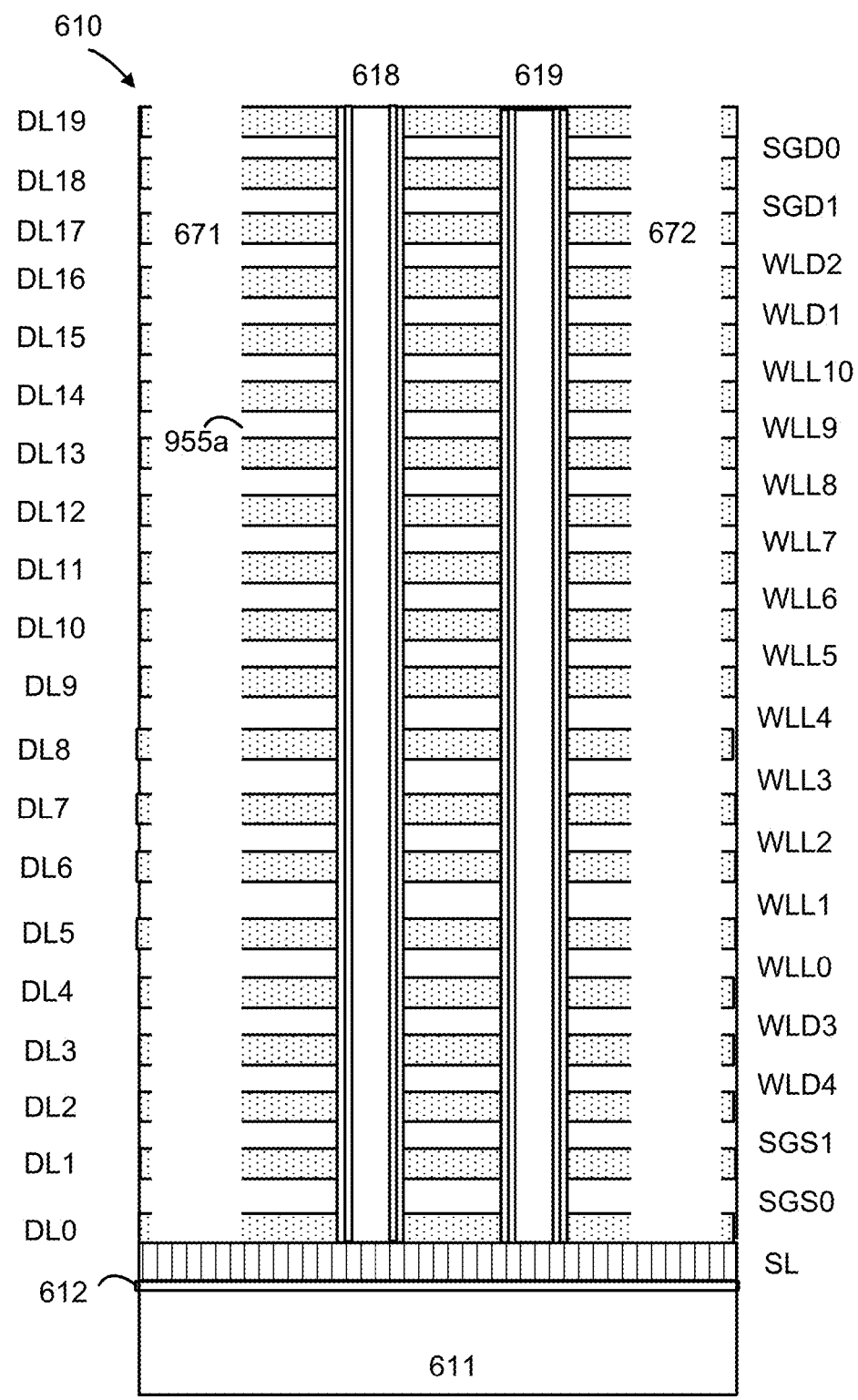
FIG. 9E depicts an example cross-sectional view of the stack of FIG. 9D after the sacrificial material 955 of the control gate layers is removed by providing an etchant in the slit, consistent with step 807 of FIG. 8.

FIG. 9E depicts an example cross-sectional view of the stack of FIG. 9D after the sacrificial material 955 of the control gate layers is removed by providing an etchant in the slit, consistent with step 807 of FIG. 8. Voids 955a of the control gate layers are depicted.

Figure 9F:
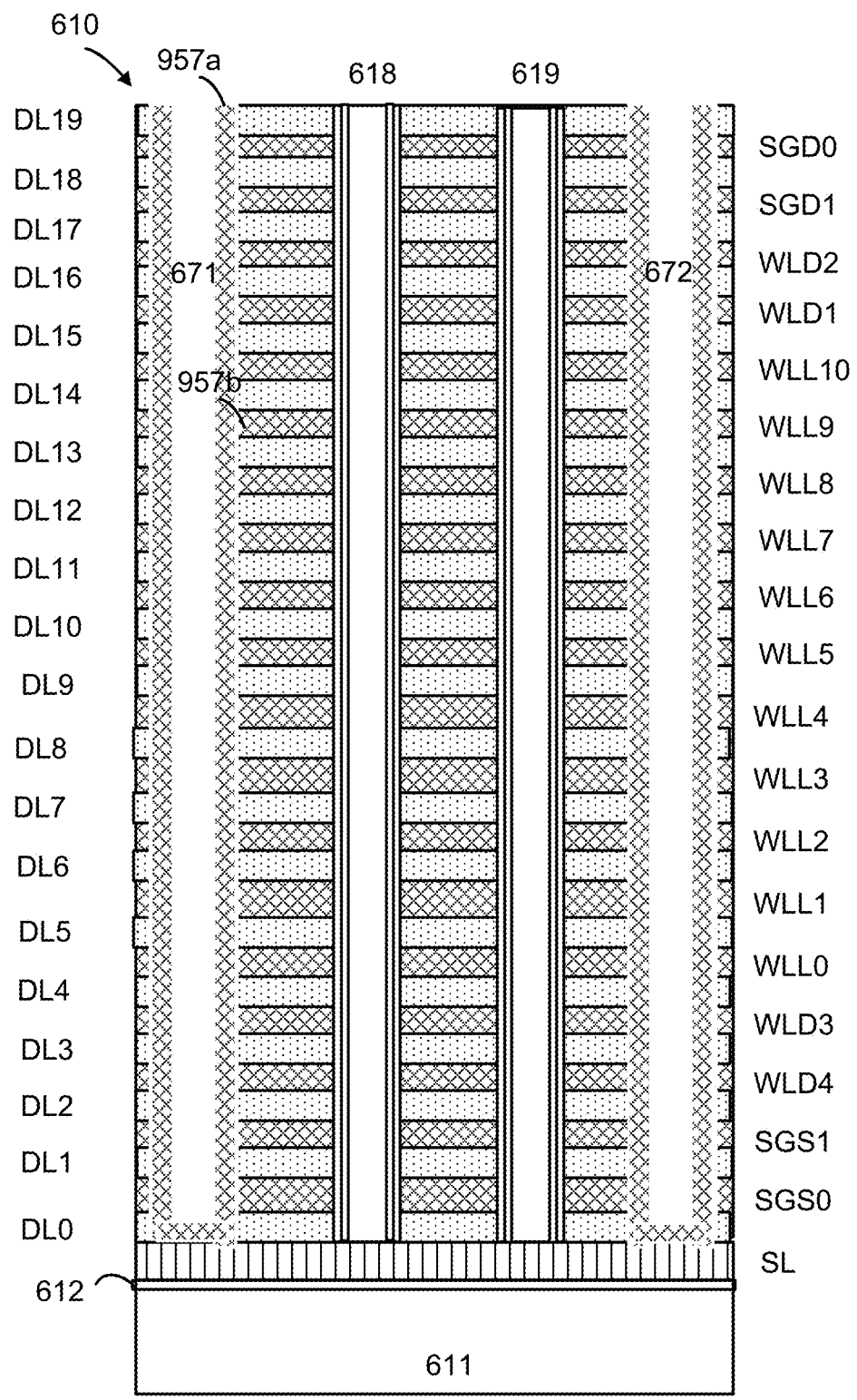
FIG. 9F depicts an example cross-sectional view of the stack of FIG. 9E after depositing a metal in the control gate layers via the slit, consistent with step 809 of FIG. 8.

FIG. 9F depicts an example cross-sectional view of the stack of FIG. 9E after depositing a metal in the control gate layers via the slit, consistent with step 809 of FIG. 8. The metal includes portions such as the portion 957b which fills the voids of the control gate layers, and a portion 957a which lines the slit.

Figure 9G:
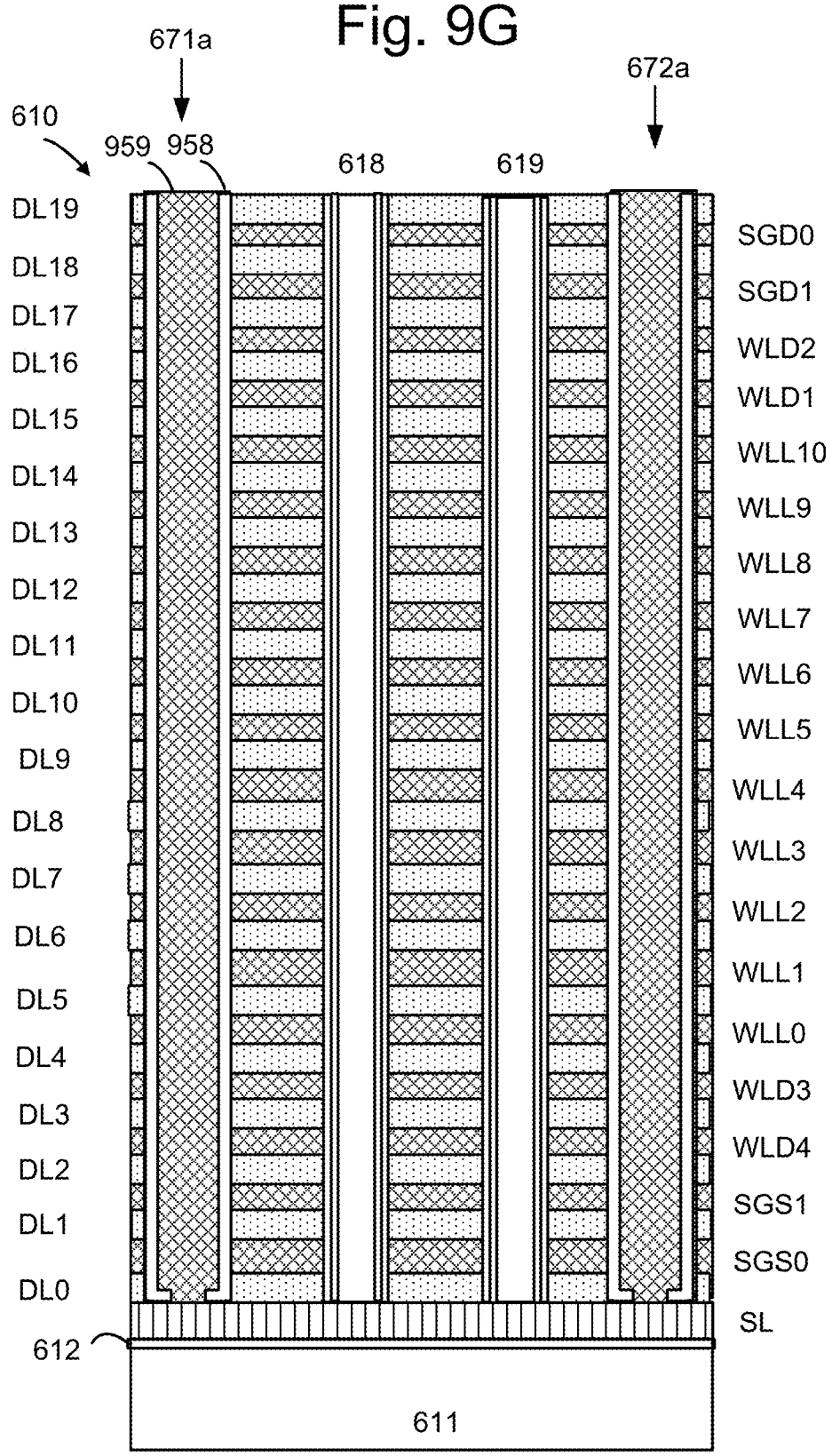
FIG. 9G depicts an example cross-sectional view of the stack of FIG. 9F after cleaning and filling in the slit, consistent with step 809 of FIG. 8.

FIG. 9G depicts an example cross-sectional view of the stack of FIG. 9F after cleaning and filling in the slit, consistent with step 809 of FIG. 8. The metal which lines the slit is cleaned away to avoid short circuiting the control gate layers. After the cleaning, an insulating liner 958 such as $SiO_2$ is deposited in the slit and the bottom of the liner is etched through. An adhesion layer such as titanium nitride (TiN) may be deposited before the metal 959. The metal forms a continuous conductive path from a bottom of the stack to the top of the stack and can therefore act as a local interconnect. Interconnects 671a and 672a are formed.

Figure 10A:
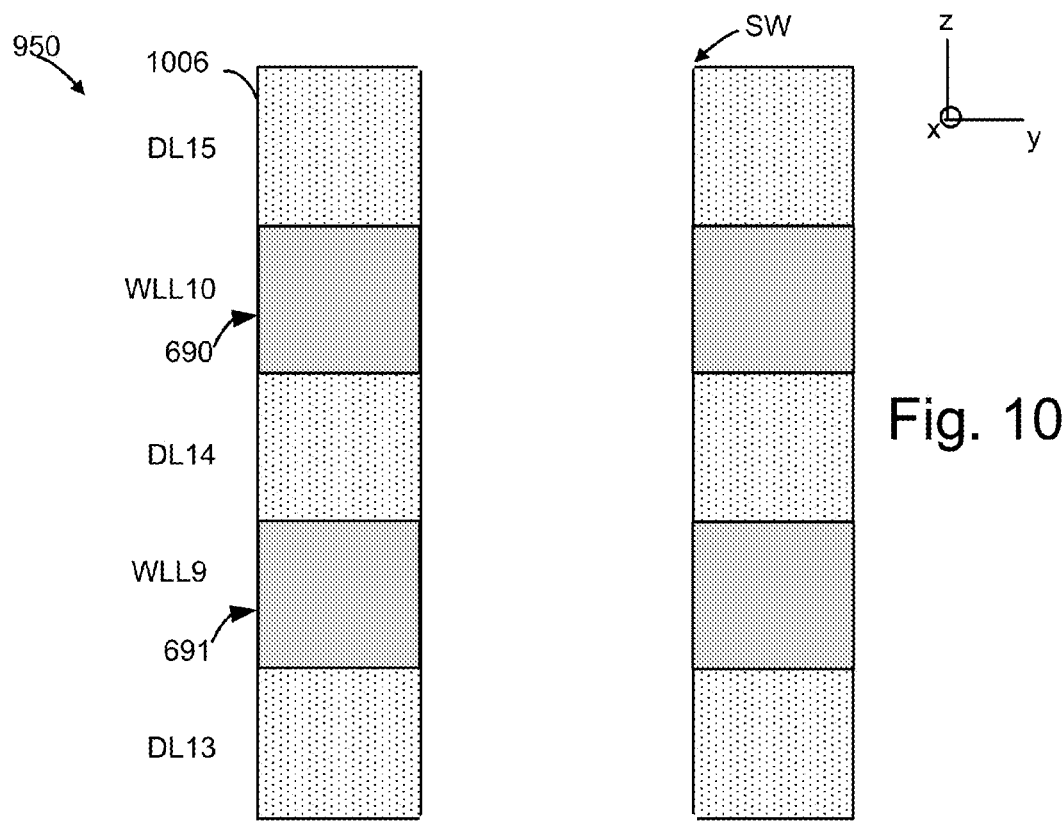
FIG. 10A depicts the region 950 of the stack of FIG. 9B after the formation of a memory hole, consistent with step 801 of FIG. 8.

FIG. 10A depicts the region 950 of the stack of FIG. 9B after the formation of a memory hole, consistent with step 801 of FIG. 8. The portion includes the dielectric layers DL13, DL14 and DL15 (including dielectric material 1006) and the control gates 691 and 690 in the word line layers WLL9 and WLL10, respectively. A sidewall SW of the memory hole is also depicted.

Figure 10B:
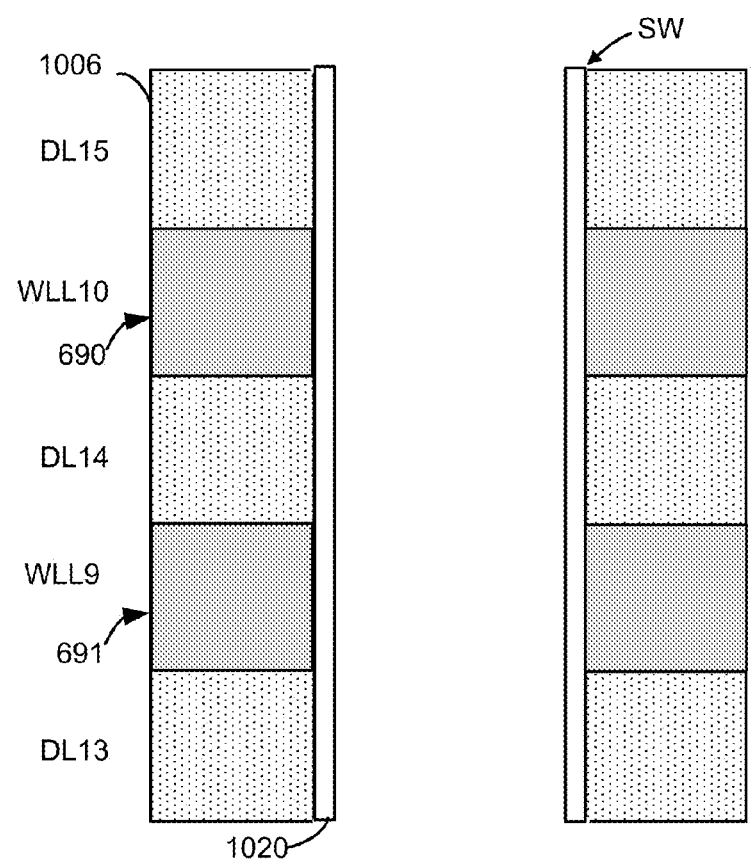
FIG. 10B depicts the region of the stack of FIG. 10A after depositing a layer of silicon nitride ($Si_3N_4$) along a sidewall of the memory hole, in a comparative example.

FIG. 10B depicts the region of the stack of FIG. 10A after depositing a layer of $Si_3N_4$ 1020 along a sidewall of the memory hole, in a comparative example.

Figure 10C:
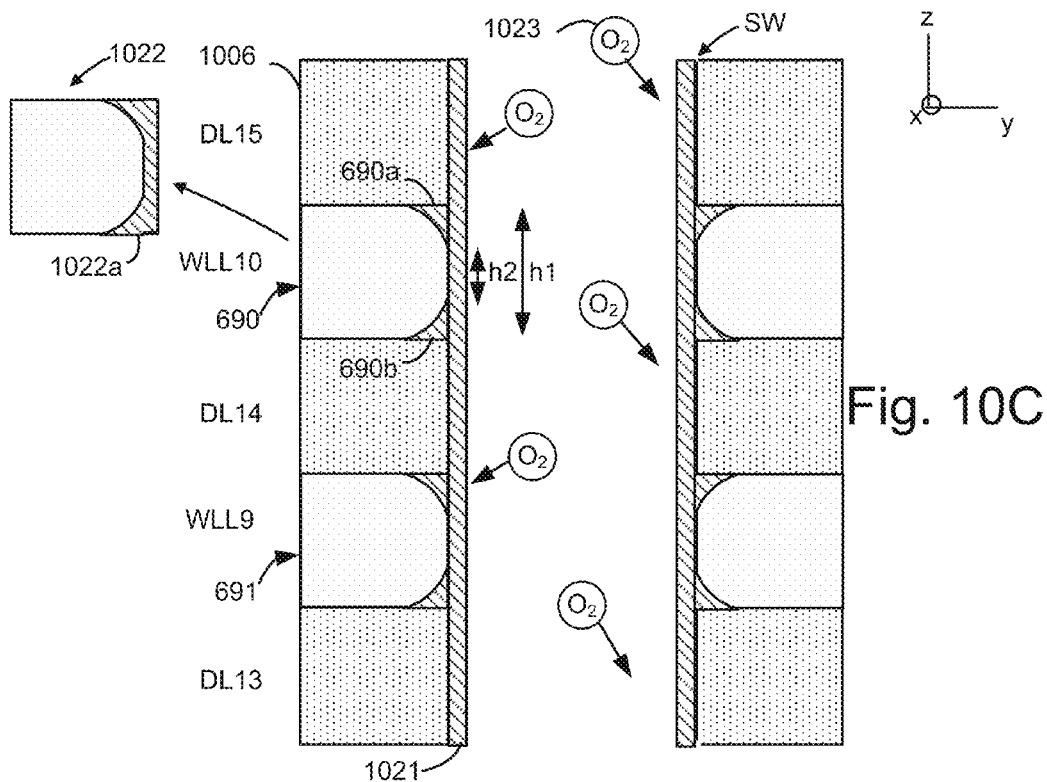
FIG. 10C depicts the region of the stack of FIG. 10B after an oxidizing step which converts the $Si_3N_4$ to $SiO_2$.

FIG. 10C depicts the region of the stack of FIG. 10B after an oxidizing step which converts the layer of $Si_3N_4$ to a layer of $SiO_2$ 1021. The oxidizing step involves providing oxygen, depicted by circles 1023, which migrates in the memory hole and interact with the $Si_3N_4$ layer to form the $SiO_2$ layer. As mentioned, the oxidizing step can inadvertently oxidize portions of the $Si_3N_4$ of the control gate layers. For example, corner portions 690a and 690b of the control gate 690 are oxidized. This phenomenon is also referred to as "gate bite." As a result, the length of the channel of the memory cell is reduced from h1 to h2. This can result in the short channel effect problems of a transistor. Moreover, the rounded corners are conducive to the formation of fringing electric fields. Another option is shown by the control gate 1022 in which the oxidized portion 1022a extends a height h1 of the control gate.

Portions of the $Si_3N_4$ of the control gate layers can also be inadvertently oxidized when an $SiO_2$ layer is deposited directly to provide the blocking oxide layer, rather than depositing $Si_3N_4$ and then oxidizing it.

Figure 10D:
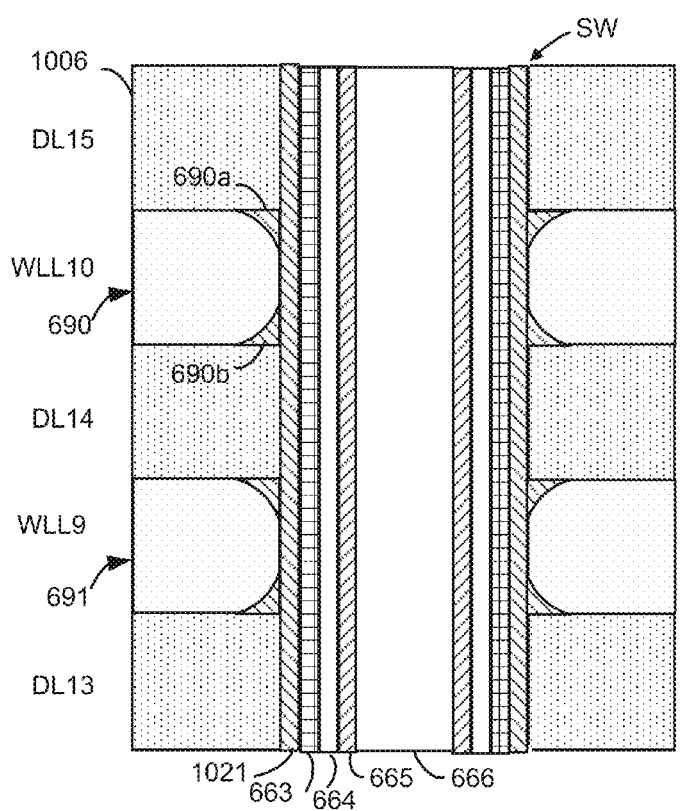
FIG. 10D depicts the region of the stack of FIG. 10C after filling in a remainder of the memory hole with a charge-trapping material, a tunnel oxide, a channel polysilicon and dielectric core.

FIG. 10D depicts the region of the stack of FIG. 10C after filling in a remainder of the memory hole with a charge-trapping layer 663, a tunneling oxide layer 664, a channel layer 665 and a dielectric core 666.

Figure 11A:
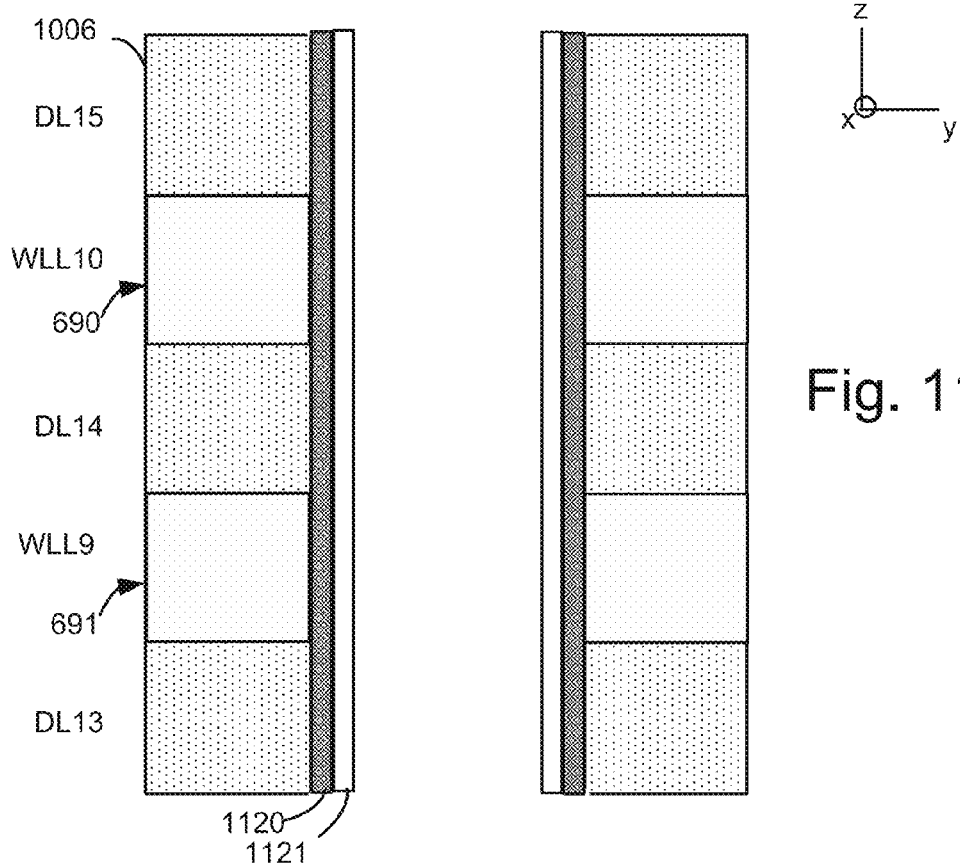
FIG. 11A depicts the region of the stack of FIG. 10A, after depositing a layer of amorphous silicon along a sidewall of the memory hole followed by a layer of $Si_3N_4$, consistent with steps 802 and 803 of FIG. 8.

FIG. 11A depicts the region of the stack of FIG. 10A, after depositing a layer of amorphous silicon 1120 along a sidewall of the memory hole followed by a layer of $Si_3N_4$ 1121, consistent with steps 802 and 803 of FIG. 8.

Figure 11B:
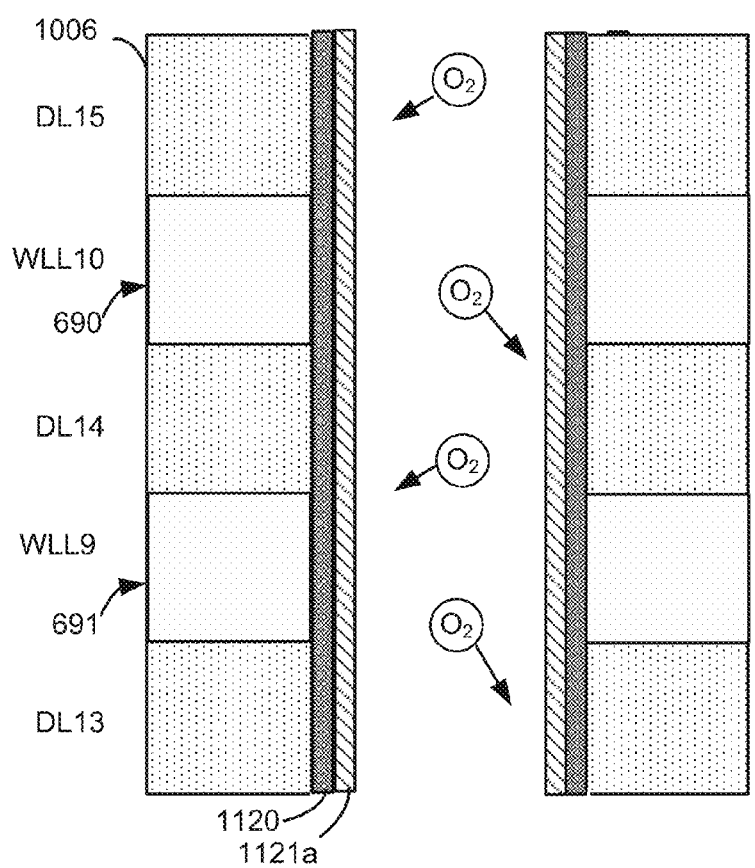
FIG. 11B depicts the region of the stack of FIG. 11A, after oxidizing the $Si_3N_4$ to form a layer comprising $SiO_2$ 1121a, consistent with step 803 of FIG. 8.

FIG. 11B depicts the region of the stack of FIG. 11A, after oxidizing the $Si_3N_4$ to form a layer comprising $SiO_2$ 1121a, consistent with step 803 of FIG. 8. The oxidizing step involves providing oxygen, depicted by circles, which migrates in the memory hole and interact with the $Si_3N_4$ layer to form the $SiO_2$ layer. The amorphous silicon layer 1120 advantageously shields the $Si_3N_4$ of the control gate layers from being oxidized.

Figure 11C:
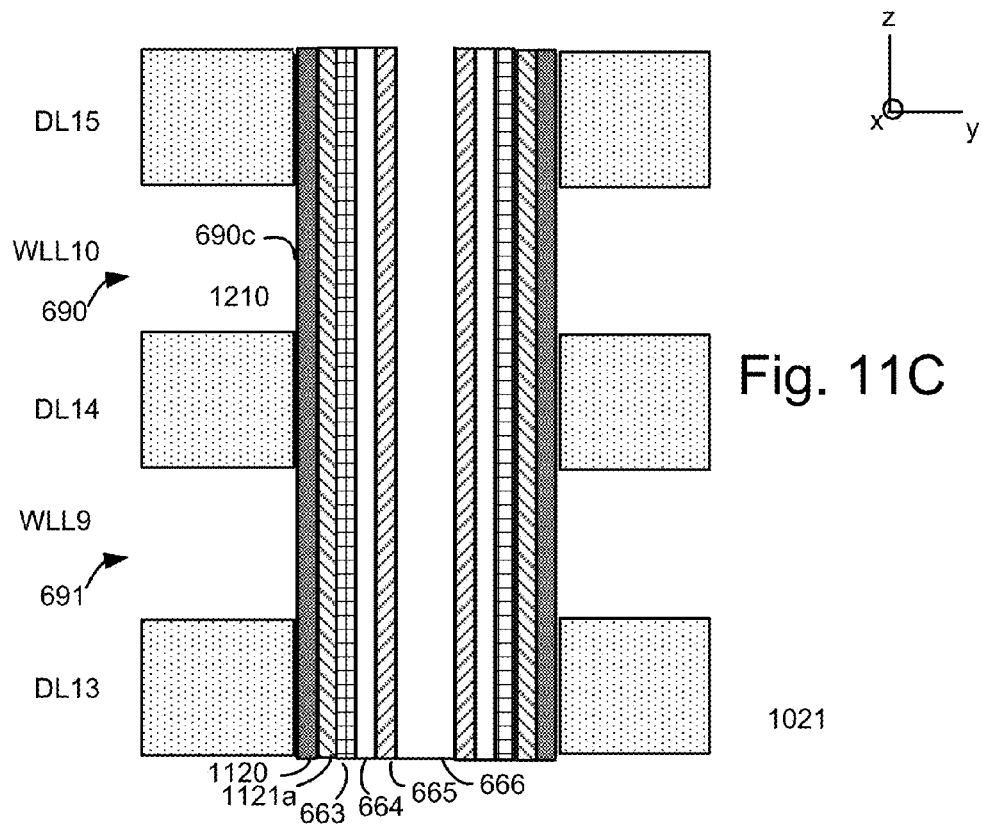
FIG. 11C depicts the region of the stack of FIG. 11B consistent with steps 805-807 of FIG. 8, where portions of the amorphous silicon layer are exposed by removing a sacrificial material in the control gate layers.

FIG. 11C depicts the region of the stack of FIG. 11B consistent with steps 805-807 of FIG. 8, where portions of the amorphous silicon layer are exposed by removing a sacrificial material in the control gate layers. First, the memory hole is filled by the charge-trapping layer 663, tunneling oxide layer 664, channel layer 665 and the dielectric core 666. Subsequently, the sacrificial material of the control gate layers is removed such that voids, e.g., void 1210, are formed in the control gate layers. Additionally, portions, e.g., portion 690*c*, of the amorphous silicon layer 1120 are exposed in the void.

Figure 11D:
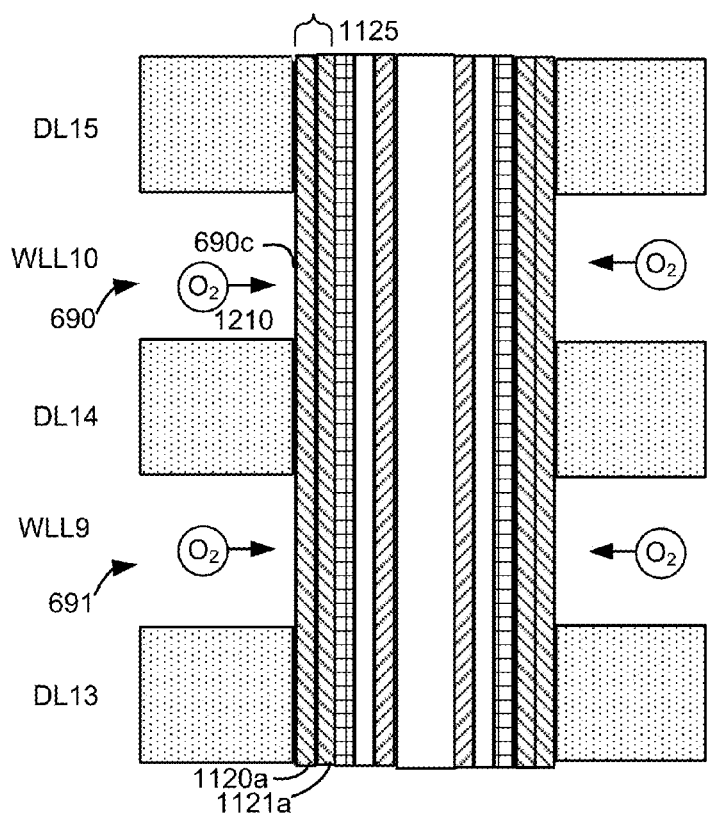
FIG. 11D depicts the region of the stack of FIG. 11C consistent with step 808 of FIG. 8, where the amorphous silicon layer is oxidized.

FIG. 11D depicts the region of the stack of FIG. 11C consistent with step 808 of FIG. 8, where the amorphous silicon layer is oxidized. The oxidizing step involves providing oxygen, depicted by circles, which migrates in the voids via the slit and interacts with the amorphous silicon layer to form an $SiO_2$ layer 1120*a*. As a result, two adjacent $SiO_2$ layers are formed. The two layers together serve as a blocking oxide layer 1125 for the memory cells. In one approach, the two layers have a similar thickness or width in the y-direction. In an example implementation, the two layers each have a thickness of about 3 nm for a total block oxide thickness of 6 nm. In one approach, a thickness of the oxidized amorphous silicon layer 1120*a* may be within +/−30% of a thickness of the $SiO_2$ layer 1121*a*, which is a material comprising oxidized silicon.

Figure 11E:
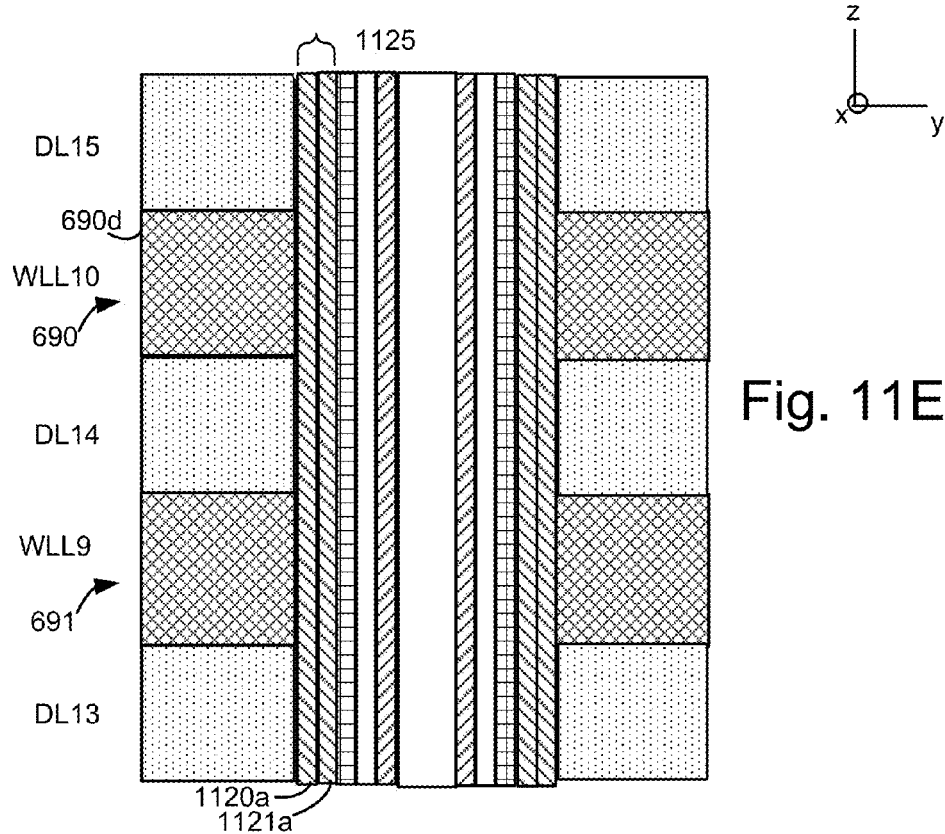
FIG. 11E depicts the region of the stack of FIG. 11D consistent with step 809 of FIG. 8, where the control gate metal is deposited.

FIG. 11E depicts the region of the stack of FIG. 11D consistent with step 809 of FIG. 8, where the control gate metal is deposited. An example metal portion 690*d* is part of the control gate layer 690, for instance. The corners of the metal portion are advantageously not rounded off so that the performance of the memory device is improved. Furthermore, the oxidized amorphous silicon layer provides a high quality block oxide layer. The resulting memory device has an improved operation, program and erase efficiency and reliability.

Figure 11F:
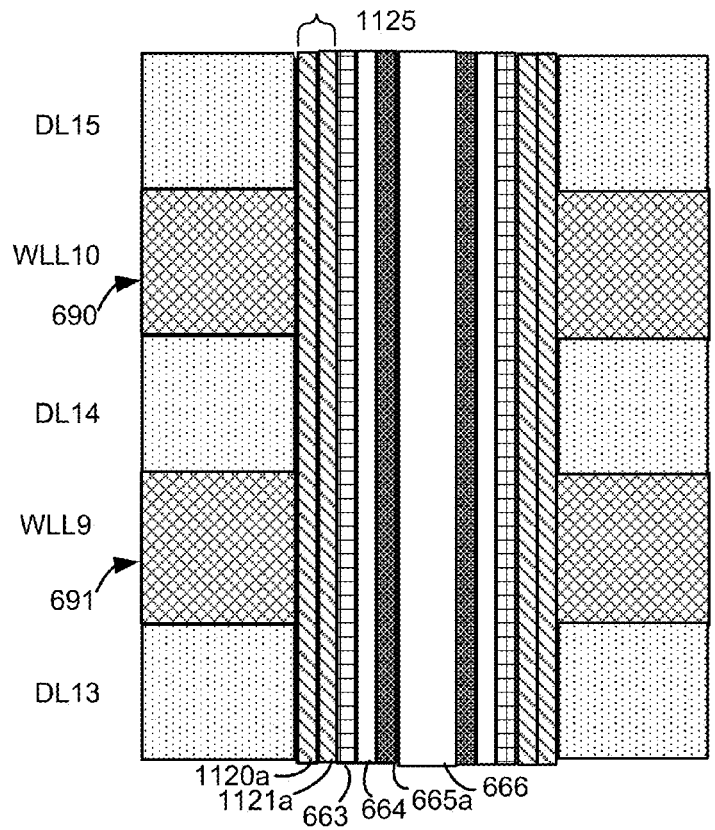
FIG. 11F depicts the region of the stack of FIG. 11D consistent with step 810 of FIG. 8, where the channel polysilicon layer is converted to a single crystal silicon layer 665a through heating.

FIG. 11F depicts the region of the stack of FIG. 11D consistent with step 810 of FIG. 8, where the channel polysilicon layer is converted to a single crystal silicon layer 665 through heating.

Figure 12A:
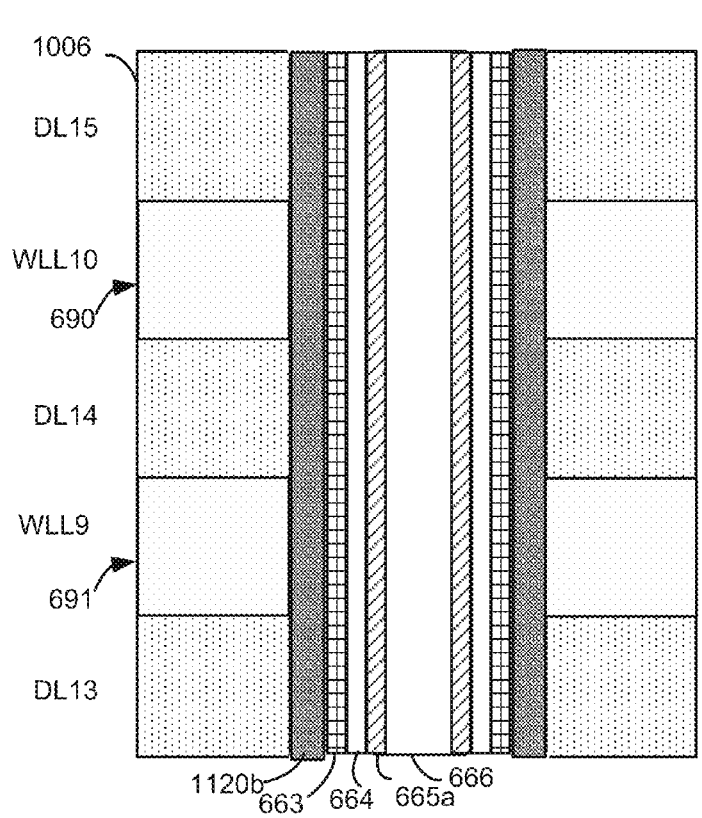
FIG. 12A depicts an alternative to FIG. 11E, where an amorphous silicon layer is provided adjacent to the charge-trapping layer.

FIG. 12A depicts an alternative to FIG. 11E, where an amorphous silicon layer 1120*b* is provided adjacent to the charge-trapping layer 663. In this approach, the amorphous silicon layer alone is used to provide the blocking oxide layer. The amorphous silicon layer can be thicker than in the examples of FIG. 11E or 11F, for instance.

Figure 12B:
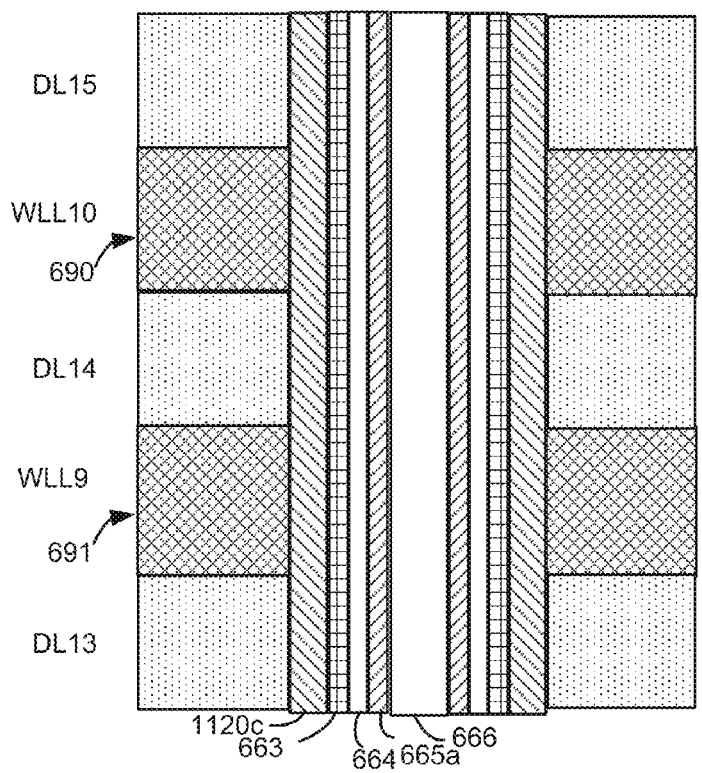
FIG. 12B depicts the region of the stack of FIG. 12A, where the amorphous silicon layer is converted to an $SiO_2$ layer 1120c.

FIG. 12B depicts the region of the stack of FIG. 12A, where the amorphous silicon layer is converted to an $SiO_2$ layer 1120*c*. The process for obtaining the example structure of FIGS. 12A and 12B follows the example of FIG. 11A to 11F except the $Si_3N_4$ layer 1121 is not provided in FIG. 11A.

Figure 13:
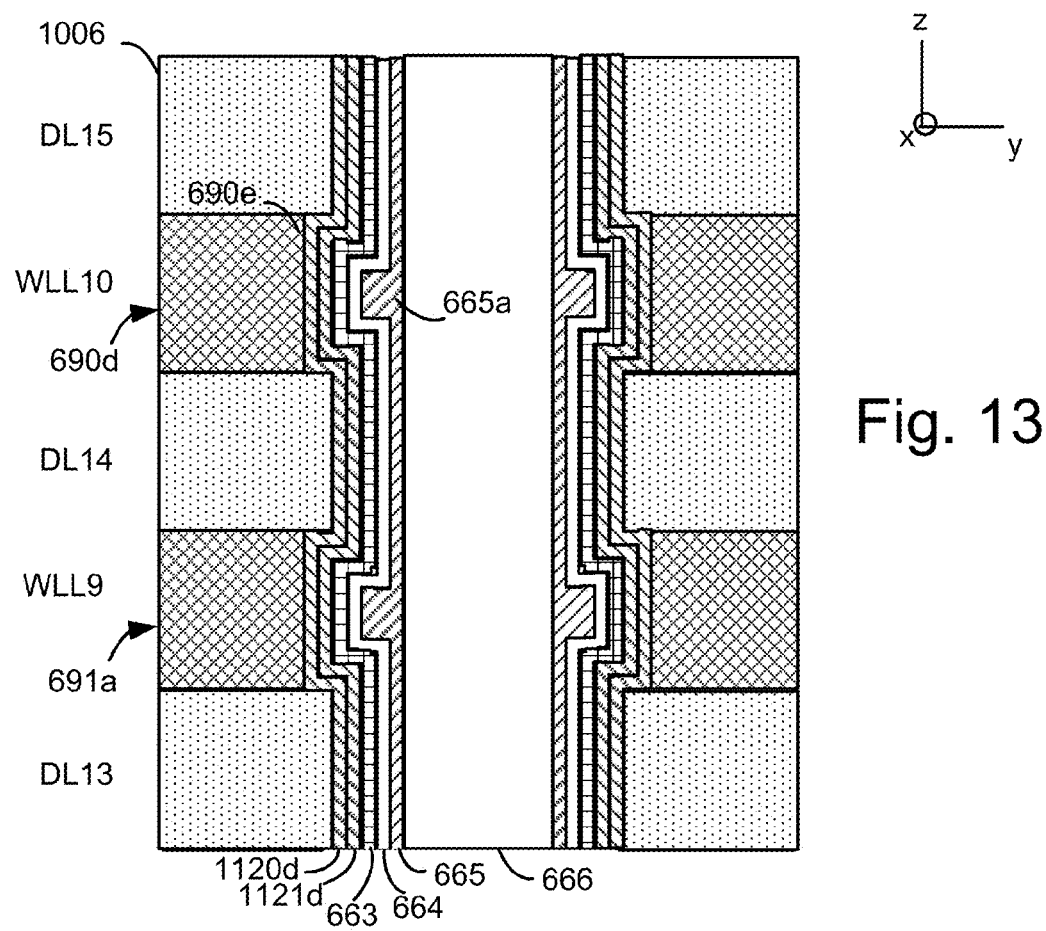
FIG. 13 depicts an alternative to FIG. 11E, 11F or 12B, where the control gate layers are recessed.

FIG. 13 depicts an alternative to FIG. 11E, 11F or 12B, where the control gate layers are recessed. The example control gate 690*d* has a recess 690*e* which is formed by providing an etchant in the memory hole. The example control gate 691*a* similarly has a recess. The subsequent layers are conformally deposited. The recess in the control gate layer increases the distance between the control gate and the channel region between the word line layers, so that the fringing electric field between the control gate and the channel region between the word line layers is weakened. The distance between the control gate and the channel region adjacent to the control gate, at the same height in the stack, is not affected because a portion 665*a* of the channel is shifted according to the recess of the control gate layer.

The layers include a first $SiO_2$ layer 1120*d* formed from amorphous silicon, a second $SiO_2$ layer 1121*d* (formed by oxidizing $Si_3N_4$ or deposited as $SiO_2$ using ALD), a charge-trapping film (663), a tunneling film (664) and a silicon channel film (665). A dielectric core 666 is also depicted.

Accordingly, it can be seen that, in one embodiment, a method comprises: forming a stack of alternating dielectric layers and control gate layers, the control gate layers comprising a sacrificial material; forming a memory hole which extends through the stack, the memory hole comprising a sidewall; depositing an amorphous silicon layer along the sidewall, adjacent to the control gate layers; forming a slit in the stack; providing an etchant in the slit to remove the sacrificial material, creating voids in the control gates layers and exposing portions of the amorphous silicon layer; oxidizing the amorphous silicon layer to provide an oxidized silicon layer, the oxidizing comprises supplying oxygen via the slit and voids; and providing a metal in the voids, after the oxidized silicon layer is formed.

In another embodiment, an apparatus consistent with FIGS. 11E, 11F and 13, for example, comprises: a stack of alternating dielectric layers and control gate layers, the control gate layers comprising a metal; and concentric films which extend through the stack, wherein the concentric films comprise a first oxidized film (1120*a*, 1120*d*) adjacent to the control gate layers and the dielectric layers, a second oxidized film (1121*a*, 1121*d*) adjacent to the first oxidized film, a charge-trapping film (663), a tunneling film (664) and a silicon channel film (665, 665*a*).

In another embodiment, a method comprises: depositing an amorphous silicon layer along a sidewall of a memory hole in a stack, the stack comprising alternating oxide and nitride layers; removing the nitride layers via another opening in the stack, creating voids and exposing portions of the amorphous silicon layer; providing oxygen via the voids to oxidize the amorphous silicon layer, providing an oxidized silicon layer; and providing a metal in the voids, after the oxidized silicon layer is formed.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method, comprising:
    forming a stack of alternating dielectric layers and sacrificial material layers;
    forming a memory hole which extends through the stack, the memory hole comprising a sidewall;
    depositing an amorphous silicon layer along the sidewall, adjacent to the dielectric layers and the sacrificial material layers, from a bottom of the memory hole to a top of the memory hole;
    depositing a material comprising silicon in the memory hole, adjacent to the amorphous silicon layer, from the bottom of the memory hole to the top of the memory hole;
    oxidizing the material comprising silicon in the memory hole to provide a material comprising oxidized silicon;
    forming a slit in the stack;

providing an etchant in the slit to remove the sacrificial material layers, creating voids which expose portions of the amorphous silicon layer at heights of the sacrificial material layers;

oxidizing the exposed portions of the amorphous silicon layer at the heights of the sacrificial material layers and portions of the amorphous silicon layer which are at heights of the dielectric layers to convert the amorphous silicon layer to an oxidized silicon layer extending from the bottom of the memory hole to the top of the memory hole, wherein the oxidizing comprises supplying oxygen via the slit and voids, and the oxidized silicon layer and the material comprising oxidized silicon together form a blocking oxide layer which extends from the bottom of the memory hole to the top of the memory hole; and providing a metal in the voids, after the oxidized silicon layer is formed.

2. The method of claim 1, wherein:
the material comprising silicon comprises $Si_3N_4$;
the material comprising oxidized silicon comprises $SiO_2$; and
the oxidized silicon layer comprises $SiO_2$.

3. The method of claim 1, wherein:
the amorphous silicon layer comprises a film with a thickness of 3 nm or less and is completely oxidized by the oxidizing step.

4. The method of claim 1, wherein:
the supplying oxygen via the slit and voids comprises performing a wet oxidation process.

5. The method of claim 1, wherein:
the sacrificial material layers comprise $Si_3N_4$ and the dielectric layers comprise oxide.

6. The method of claim 1, further comprising:
providing an etchant in the memory hole to recess the sacrificial material layers before the providing the amorphous silicon layer along the sidewall.

7. The method of claim 1, further comprising:
providing a charge-trapping layer, a tunneling layer, and a channel layer in the memory holes, after the providing the amorphous silicon layer along the sidewall and before the oxidizing the amorphous silicon layer.

8. The method of claim 7, wherein:
the providing the channel layer comprises depositing polysilicon adjacent to the tunneling layer and heating the polysilicon to form single crystal silicon.

9. The method of claim 1, wherein:
the amorphous silicon layer is deposited along the sidewall, adjacent to the dielectric layers and the sacrificial material layers, with no other layer between the amorphous layer and the dielectric layers and the sacrificial material layers.

10. The method of claim 1, wherein:
the oxygen is supplied by a wet oxidizing agent in the voids which migrates to reach the portions of the amorphous silicon layer which are at the heights of the dielectric layers.

11. The method of claim 1, wherein:
the amorphous silicon layer shields the sacrificial material layers from being oxidized during the oxidizing of the material comprising silicon.

12. A method, comprising:
depositing an amorphous silicon layer along a sidewall of a memory hole in a stack, the stack comprising alternating oxide and nitride layers;
depositing a $Si_3N_4$ layer in the memory hole, adjacent to the amorphous silicon layer;
oxidizing the $Si_3N_4$ layer to form a first $SiO_2$ layer;
after the oxidizing the $Si_3N_4$ layer, removing the nitride layers via another opening in the stack, creating voids and exposing portions of the amorphous silicon layer;
after the removing the nitride layers, providing oxygen via the voids to oxidize the amorphous silicon layer, thereby providing a second $SiO_2$ layer extending from a bottom of the stack to a top of the stack, wherein the first $SiO_2$ layer and the second $SiO_2$ layer together form a blocking oxide layer extending from a bottom of the stack to a top of the stack; and
providing a metal in the voids, after the second $SiO_2$ layer is formed.

13. The method of claim 12, wherein:
an atomic percentage of hydrogen is lower in the second $SiO_2$ layer than in the first $SiO_2$ layer.

14. The method of claim 12, wherein:
the amorphous silicon layer shields the nitride layers from being oxidized during the oxidizing of the $Si_3N_4$ layer.

* * * * *